US012573997B2

(12) United States Patent
Sekhar et al.

(10) Patent No.: US 12,573,997 B2
(45) Date of Patent: Mar. 10, 2026

(54) NON-LINEAR COMPENSATION IN BANDPASS FILTERS

(71) Applicant: Texas Instruments Incorporated, Dallas, TX (US)

(72) Inventors: Raja Sekhar, Bangalore (IN); Prashuk Jain, Bangalore (IN); Sandeep Oswal, Bangalore (IN); Ravikumar Pattipaka, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 232 days.

(21) Appl. No.: 18/217,325

(22) Filed: Jun. 30, 2023

(65) Prior Publication Data

US 2025/0007484 A1    Jan. 2, 2025

(51) Int. Cl.
  *H03H 7/01*        (2006.01)
  *H04B 1/04*        (2006.01)
(52) U.S. Cl.
  CPC ......... *H03H 7/0161* (2013.01); *H04B 1/0475* (2013.01)
(58) Field of Classification Search
  CPC ....... H03H 7/01; H03H 7/0153; H03H 7/0161
  USPC ........ 327/557; 333/165, 166, 167, 172, 173, 333/174
  See application file for complete search history.

(56) References Cited

U.S. PATENT DOCUMENTS

| | | | |
|---|---|---|---|
| 12,057,814 B2 * | 8/2024 | Xu ....................... | H03H 11/126 |
| 2024/0213940 A1 * | 6/2024 | Manetakis ........... | H03D 7/1491 |

OTHER PUBLICATIONS

Freeborn et al., "Fractional-step Tow-Thomas biquad filters," Paper, NOLTA, Nonlinear Theory and its Applications, IEICE, vol. 3, No. 3, published Jul. 1, 2012, 18 pages.
Zhang et al, "A CMOS Programmable Fourth-Order Butterworth Active-RC Low-Pass Filter," Article, MDPI (www.mdpi.com/journal/electronics), published Jan. 21, 2020, 9 pages.

* cited by examiner

*Primary Examiner* — Hai L Nguyen
(74) *Attorney, Agent, or Firm* — Xianghui Huang; Frank D. Cimino

(57) ABSTRACT

Methods, apparatus, systems, and articles of manufacture are described corresponding to current limit circuitry with controlled current variation. An example circuit includes an amplifier having an input terminal and an output terminal; a capacitor having a first terminal and a second terminal, the first terminal of the capacitor coupled to the input terminal of the amplifier, the second terminal of the capacitor coupled to the output terminal of the amplifier; and diode circuitry having a first terminal and a second terminal, the first terminal of the diode circuitry coupled to the first terminal of the capacitor and the input terminal of the amplifier, the second terminal of the diode circuitry coupled to the second terminal of the capacitor and the output terminal of the amplifier.

21 Claims, 12 Drawing Sheets

NON-LINEAR COMPENSATION IN BANDPASS FILTERS

FIELD OF THE DISCLOSURE

This disclosure relates generally to circuits, and, more particularly, to bandpass filters with non-linear compensation.

BACKGROUND

Bandpass filters are electrical components that block low frequency and high frequency signals and allow signals within a range of frequencies to pass through. Bandpass filters are used in a wide range of fields including medical imaging, telecommunications, data transfer, and/or other fields that utilize analog signals. In some examples, a bandpass filter is implemented by a feedback system that includes two back-to-back integrators. The integrators may be implemented by an amplifier (e.g., a differential amplifier, a fully differential amplifier, etc.) in conjunction with other components (e.g., resistors, capacitors, etc.).

SUMMARY

In at least one example of the description, a circuit includes an amplifier having an input terminal and an output terminal; a capacitor having a first terminal and a second terminal, the first terminal of the capacitor coupled to the input terminal of the amplifier, the second terminal of the capacitor coupled to the output terminal of the amplifier; and diode circuitry having a first terminal and a second terminal, the first terminal of the diode circuitry coupled to the first terminal of the capacitor and the input terminal of the amplifier, the second terminal of the diode circuitry coupled to the second terminal of the capacitor and the output terminal of the amplifier.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
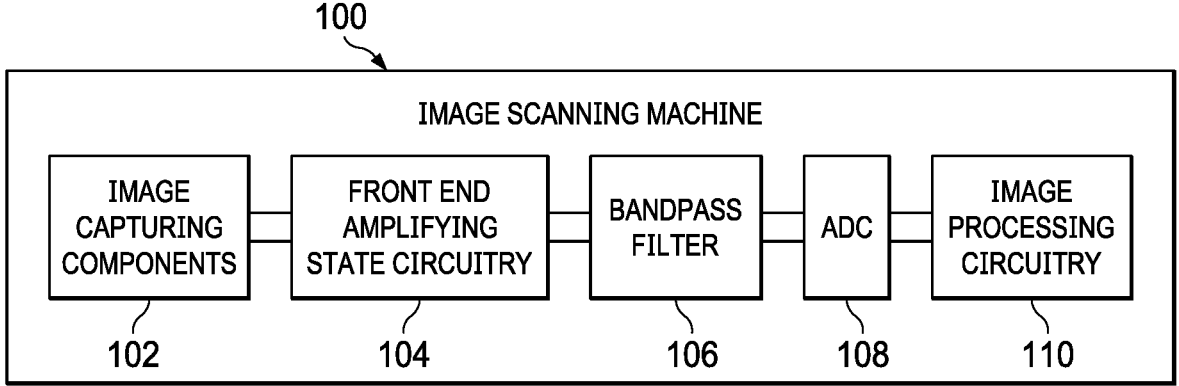
FIG. 1 is an example medical imaging machine for implementing a bandpass filter in conjunction with examples described herein.

The drawings are not necessarily to scale. Generally, the same reference numbers in the drawing(s) and this description refer to the same or like parts. Although the drawings show regions with clean lines and boundaries, some or all of these lines and/or boundaries may be idealized. In reality, the boundaries and/or lines may be unobservable, blended and/or irregular.

Some bandpass filters utilize a feedback system with two back-to-back integrators. A bandpass filter allows signals to pass through at a range of frequencies defined by a center frequency and a bandwidth. The center frequency (referred to herein as $\omega_0$) is the frequency at which a bandpass filter gain is the set passband gain. The bandwidth (BW or $\omega_B$) of a bandpass filter corresponds to the frequency ranges above and below the center frequency at which a signal can pass with less than X (e.g., 3) db of attenuation, for example the lowest and highest frequencies that corresponds to a threshold amount of gain below the center frequency gain. The bandwidth of a bandpass filter is characterized by a quality value (Q). The quality value, or quality factor, of a bandpass filter is the center frequency divided by the bandwidth ($Q=\omega_0/\omega_B$). For a given center frequency, a higher quality value corresponds to a narrower passband and a lower quality corresponds to a wider passband.

As described above, a bandpass filter may include two back-to-back integrators. For example, a Tow-Thomas biquad bandpass filter includes two back-to-back integrators. To control the characteristics of the bandpass filter (e.g., the center frequency and/or bandwidth), the bandpass filter can be implemented with a lossy integrator (also referred to as a practical integrator) and a lossless integrator. The lossless integrator includes an amplifier with one input terminal coupled to the output terminal via a capacitor and does not include a feedback resistor. The lossy integrator includes an amplifier with one input terminal coupled to the output terminal via a capacitor and a resistor (e.g., a feedback resistor) in parallel. Both types of integrators include a resistor (e.g., an input resistor) coupled to the input of the amplifier. The transfer function of the lossy integrator is $$\frac{-R_1}{R_2}\left(\frac{1}{1+sCR_s}\right),$$

where R1 is the input resistor, R2 is the feedback resistor, C is the capacitor, and s is a complex variable corresponding to the relationship between the output and the input of the lossy input system. Because the transfer function of the lossy integrator corresponds to the resistances of the resistors, resistors with particular resistances can be selected to control the center frequency and/or bandwidth of the bandpass filter. For example, the quality and/or bandwidth of the bandpass filter is based on the selected resistance of the feedback resistor.

As described above, bandpass filters include a feedback loop. Accordingly, bandpass filters can be unstable if not designed properly. Bandpass filters can also exhibit signal dependent stability behavior. Accordingly, a simple small signal stability is not enough to ensure filter stability across a full working voltage swing range. Instability of a bandpass filter results in sustained oscillations at the output of the bandpass filter if the amplitude of the input signal is too high, for example due to noise and/or characteristics of the device that generates the input signal). The stability of the bandpass filter depends on the frequency of the non-dominant pole for the bandpass filter and the frequency of the unity gain crossover point of the bandpass back to back integrator loop. The non-dominant pole for the bandpass filter is located at a frequency corresponding to a ratio of the center frequency and the quality factor (e.g., $\omega_c/Q$). The unity gain crossover point (also referred to as unity gain crossing) is the frequency at which the gain of the lossy integrator is 0 dB). A phase loss contribution of a non-dominant pole of a back loop at a unity gain crossover point reduces the phase margin of the loop, thereby decreasing the stability of the bandpass filter. For example, the closer the frequency of the non-dominant pole is to the unity gain crossover point, the larger the effect the phase of the non-dominant pole has on the phase margin of the unity gain crossover point, which corresponds to a less stable system.

Examples described herein increase the stability of a bandpass filter by decreasing the feedback resistance of the lossy integrator responsive to the input voltage exceeding a first threshold or falling below a second threshold. The DC gain of the lossy amplifier is a function of the feedback resistance (e.g., $-R2/R1$). The DC gain corresponds to the quality factor (Q) of the filter and determines the unity gain crossover of the feedback loop. Also, as described above, the frequency of the non-dominant pole is a function of the quality of the lossy integrator, and the quality of the lossy integrator is a function of the feedback resistance. Accordingly, by decreasing the feedback resistance responsive to the input voltage exceeding a maximum threshold (or falling below a minimum threshold), the frequency of the unity gain crossover point decreases to a lower frequency, and the frequency of the non-dominant pole increases in frequency to increase the distance between the two frequencies. Thus, the phase contribution of the non-dominant pole has a smaller (or zero) effect on the phase margin of the unity gain crossing point to increase the stability of the bandpass filter. Examples described herein utilize diode circuitry as a feedback in the lossy integrator to decrease feedback resistance of the lossy integrator responsive to the input voltage exceeding a threshold, as further described below. Examples described herein result in a stable system that is reliable and provides rapid overload recovery in a bandpass filter.

FIG. 1 illustrates an example image scanning machine 100. The image scanning machine 100 of FIG. 1 includes example image capturing components 102, example front end amplifying state circuitry 104, an example bandpass filter 106 (also referred to as a bandpass filter circuit or bandpass filter circuitry), an example analog-to-digital converter (ADC) 108, and example image processing circuitry 110. Although the bandpass filter 106 is implemented in the image scanning machine 100 of FIG. 1, the bandpass filter 106 may be implemented by itself (e.g., in a dedicated circuit or IC) or in any circuit where a bandpass filter is desired, for example audio processing, image processing, telecommunications, automotive systems, and/or any other type of electronics that may include a bandpass filter. The image scanning machine 100 of FIG. 1 is a medical image scanning machine, for example a magnetic resonance imaging (MRI) machine, an ultrasound machine, etc. However, the image scanning machine 100 may be any type of image scanning machine. Although the example components are connected via two connections (e.g., an inverting connection and a non-inverting connection), the components may be connected via a single connection. The non-inverting connection corresponds to the analog signal generated by image capture components 102. The analog signal is herein referred to as the non-inverted input signal. The inverting connection corresponds to the inverse of the analog signal generated by the image capture components 102. The inverse of the analog signal is herein referred to as an inverted input signal.

The image capturing components 102 are sensors and/or transducers that transmit and/or receive signals to generate an image. For example, in an ultrasound system, the image capturing components 102 transmit sound waves into a body. The image capturing components 102 then receive or sense reflected sound waves that reflect off tissues of the body. In an MRI system, the image capturing components 102 generate a magnetic field and detect the energy released as protons realign with the magnetic field. The image capturing components 102 transmit one or more analog signals corresponding to an image to the front end amplifying state circuitry 104. The front end amplifying state circuitry 104 is an instrumentation amplifier topology that amplifies the signal from the image capturing components 102. The front end amplifying state circuitry 104 outputs the amplified image signals to the bandpass filter 106.

The bandpass filter 106 of FIG. 1 filters out high frequency signals (e.g., signals above a first frequency threshold) and low frequency signals (e.g., signals below a second frequency threshold). As further described below, the bandpass filter 106 decreases the feedback resistance responsive to the input signal exceeding a maximum threshold amplitude (or falling below a minimum threshold amplitude), thereby decreasing the frequency of the unity gain crossover point and increasing the frequency of the non-dominant pole. The difference between the frequencies of the unity gain crossover point and the non-dominant pole is increased so that the phase contribution of the non-dominant pole has a smaller effect on the phase margin unity gain cross over point. As described above, lowering the effect of the phase contribution of the non-dominant pole on the phase margin of the unity gain crossover point increases the stability of the bandpass filter 106. The bandpass filter 106 outputs the filtered output to the ADC 108. The ADC 108 converts the filtered analog signal to a digital value that the image processing circuitry 110 uses to generate an image that can be output by an interface (e.g., a user interface). The bandpass filter 106 is further described below in conjunction with FIGS. 2-10.

Figure 2:
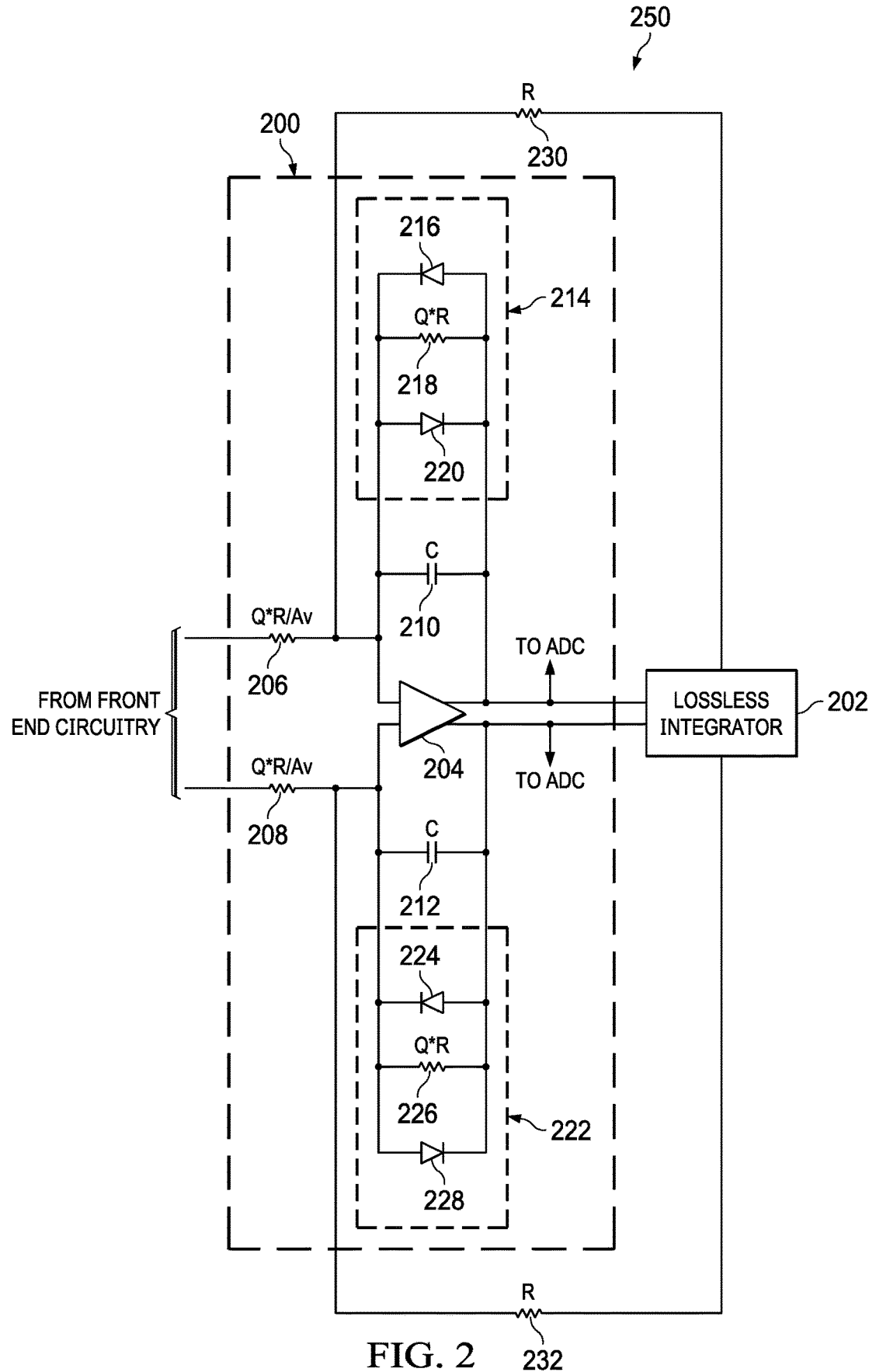
FIG. 2 is an example fully differential implementation of the bandpass filter of FIG. 1.

FIG. 2 is an example circuit diagram of an example bandpass filter 250 for implementing the bandpass filter 106 shown in FIG. 1. The bandpass filter 250 of FIG. 2 includes an example lossy integrator 200 and an example lossless integrator 202. As described above, a lossy integrator includes a feedback resistor coupled in parallel to a feedback capacitor. Whereas, a lossless integrator only includes a feedback capacitor. The lossy integrator 200 includes an example fully differential amplifier 204, example resistors 206, 208, example feedback capacitors 210, 212, example diode circuitry 214, 222, example diodes 216, 220, 224, 228, and example resistors 218, 226. The example bandpass filter 250 further includes feedback resistors 230, 232. The fully differential amplifier 204 has both differential inputs and differential outputs.

The outputs of the example front end amplifying state circuitry 104 are coupled to input terminals of the lossy integrator 200. Output terminals of the lossy integrator 200 are coupled to input terminals of the lossless integrator 202. Output terminals of the lossless integrator 202 are coupled to the input terminals of the fully differential amplifier 204 via the feedback resistors 230, 232.

The fully differential amplifier 204 of FIG. 2 amplifies the input signals. The fully differential amplifier 204 has two input terminals (e.g., an inverting input terminal and a non-inverting input terminal) and two output terminals (e.g., an inverting output terminal and a non-inverting output terminal). The first input terminal (e.g., the inverting input terminal) of the fully differential amplifier 204 is coupled to the second terminal of the resistor 206, the first terminal of the resistor 230, the cathode terminal of the diode 216, the first terminal of the resistor 218, the anode terminal of the diode 220, and the first terminal of the capacitor 210. The second input terminal (e.g., the non-inverting input terminal) of the fully differential amplifier 204 is coupled to the first terminal of the resistor 232, the cathode terminal of the diode 224, the first terminal of the resistor 226, the anode terminal of the diode 228, and the first terminal of the capacitor 212. The first output terminal (e.g., the non-inverting output terminal) of the fully differential amplifier 204 is coupled to the ADC 108, a first input terminal of lossless integrator 202, the anode terminal of the diode 216, the second terminal of the resistor 218, the cathode terminal of the diode 220, and the second terminal of the capacitor 210. The second output terminal (e.g., the inverting output terminal) of the fully differential amplifier 204 is coupled to the ADC 108, a second input terminal of lossless integrator 202, the anode terminal of the diode 224, the second terminal of the resistor 226, the cathode terminal of the diode 228, and the second terminal of the capacitor 212.

The input resistors 206, 208 of the lossy integrator 200 of FIG. 2 have two terminals. The first terminals of the resistors 206, 208 are coupled to the front end amplifying state circuitry 104. The second terminal of the resistor 206 is coupled to the first terminal of the resistor 230, the cathode terminal of the diode 216, the first terminal of the resistor 218, the anode terminal of the diode 220, the first terminal of the capacitor 210, and the first input terminal of the fully differential amplifier 204. The second terminal of the resistor 208 is coupled to the first terminal of the resistor 232, the cathode terminal of the diode 224, the first terminal of the resistor 226, the anode terminal of the diode 228, and the first terminal of the capacitor 212, and the second input terminal of the fully differential amplifier 204. The resistances of the resistor 206, 208 can be selected based on a desired gain of the lossy amplifier 200. The non-inverted input signal from the front end amplifying state circuitry 104 is received via the resistor 206 and the inverted input signal the front end amplifying state circuitry 104 is received via the resistor 208. The resistance of the resistors 206, 208 can be selected for a desired quality value (Q) and/or a desired bandpass gain (Av).

The feedback capacitors 210, 212 of FIG. 2 operates a short for high frequency signals and bypasses the resistance of the respective resistor 218, 226 and/or the resistance of the respective diodes 216, 220, 224, 228. The resistance of the resistors 218, 226 can be selected for a desired quality value (Q). Also, the capacitors 210, 212 reduces the gain of the amplifier 204. The first terminal of the capacitor 210 is coupled to the first terminal of the resistor 230, the cathode terminal of the diode 216, the first terminal of the resistor 218, the anode terminal of the diode 220, the second terminal of the resistor 206, the first terminal of the resistor 230, and the first input terminal of the fully differential amplifier 204.

The diode circuitries 214, 222 of FIG. 2 reduce the feedback resistance for the fully differential amplifier 204 responsive to the input voltage exceeding a first threshold or falling below a second threshold. In FIG. 2, the diode circuitry 214 includes the diodes 216, 220 and the resistor 218. Also, the diode circuitry 222 includes the diodes 224, 228, and the resistor 226. However, the diode circuitry 214 can be implemented with transistors, as further described below in conjunction with FIGS. 5-10.

The diode 216 of FIG. 2 has an anode terminal and a cathode terminal. The anode terminal of the diode 216 is coupled to the second terminal of the resistor 218, the cathode terminal of the diode 220, the second terminal of the capacitor 210, the first output terminal of the fully differential amplifier 204, the ADC 108, and the first input of the lossless integrator 202. The cathode terminal of the diode 216 is coupled to the first terminal of the resistor 218, the anode terminal of the diode 220, the first terminal of the capacitor 210, the second terminal of the resistor 206, the first terminal of the resistor 230, and the first input terminal of the fully differential amplifier 204. The diode 216 operates as a high (e.g., infinite) resistance resistor responsive to the output voltage falling below a threshold voltage (e.g., the turn-on, forward voltage, and/or nonlinear compensation voltage of the diode 216) and operates as a low resistance (also referred to as low impedance) closed switch responsive to the output voltage exceeding the threshold voltage.

The resistor 218 of FIG. 2 is a feedback resistor that is selected for particular characteristics of the lossy integrator 200, for example the bandwidth, gain, center frequency, and/or quality). The resistors 218 have two terminals. The first terminal of the resistor 218 is coupled to the cathode terminal of the diode 216, the anode terminal of the diode 220, the first terminal of the capacitor 210, the second terminal of the resistor 206, the first terminal of the resistor 230, and the first terminal of the fully differential amplifier 204. The second terminal of the resistor 218 is coupled to the anode terminal of the diode 216, the cathode terminal of the diode 220, the second terminal of the capacitor 210, the first output terminal of the fully differential amplifier 204, the ADC 108, and the first output of the lossless integrator 202.

The diode 220 of FIG. 2 includes an anode terminal and a cathode terminal. The cathode terminal of the diode 220 is coupled to the second terminal of the resistor 218, the anode terminal of the diode 216, the second terminal of the capacitor 210, the first output terminal of the fully differential amplifier 204, the ADC 108, and the first input lossless integrator 202. The cathode terminal of the diode 220 is coupled to the first terminal of the resistor 218, the anode terminal of the diode 216, the first terminal of the capacitor 210, the second terminal of the resistor 206, the first terminal of the resistor 230, and the first input terminal of the fully differential amplifier 204. The diode 220 operates as a high (e.g., infinite) resistance resistor responsive to the output voltage falling below a threshold voltage, for example the turn-on or forward voltage of the diode 220. Also, the diode 220 operates as a low resistance closed switch responsive to the output voltage exceeding the threshold voltage.

The diode 224 of FIG. 2 includes an anode terminal and a cathode terminal. The anode terminal of the diode 224 is coupled to the second terminal of the resistor 226, the cathode terminal of the diode 228, the second terminal of the capacitor 210, the second output terminal of the fully differential amplifier 204, the ADC 108, and the first input lossless integrator 202. The cathode terminal of the diode 224 is coupled to the first terminal of the resistor 226, the anode terminal of the diode 228, the first terminal of the capacitor 210, the second terminal of the resistor 208, the first terminal of the resistor 232, and the second input terminal of the fully differential amplifier 204. The diode 224 operates as a high (e.g., infinite) resistance resistor responsive to the output voltage falling below a threshold voltage (e.g., the turn-on or forward voltage of the diode 224) and operates as a low resistance closed switch responsive to the output voltage exceeding the threshold voltage.

The resistor 226 of FIG. 2 is a feedback resistor that is selected for particular characteristics of the lossy integrator 200, for example the bandwidth, gain, center frequency, and/or quality. The resistors 226 have two terminals. The first terminal of the resistor 226 is coupled to the cathode terminal of the diode 224, the anode terminal of the diode 228, the first terminal of the capacitor 210, the second terminal of the resistor 208, the first terminal of the resistor 232, and the second input terminal of the fully differential amplifier 204. The second terminal of the resistor 226 is coupled to the anode terminal of the diode 224, the cathode terminal of the diode 228, the second terminal of the capacitor 210, the second output terminal of the fully differential amplifier 204, the ADC 108, and the first input of the lossless integrator 202.

The diode 228 of FIG. 2 has an anode terminal and a cathode terminal. The cathode terminal of the diode 228 is coupled to the second terminal of the resistor 226, the anode terminal of the diode 224, the second terminal of the capacitor 210, the second output terminal of the fully differential amplifier 204, the ADC 108, and the first input lossless integrator 202. The cathode terminal of the diode 228 is coupled to the first terminal of the resistor 226, the anode terminal of the diode 224, the first terminal of the capacitor 210, the second terminal of the resistor 208, the first terminal of the resistor 232, and the second input terminal of the fully differential amplifier 204. The diode 228 operates as a high (e.g., infinite) resistance resistor responsive to the output voltage falling below a threshold voltage (e.g., the turn-on or forward voltage of the diode 228) and operates as a low resistance closed switch responsive to the output voltage exceeding the threshold voltage.

In operation, responsive to a non-inverted input voltage being above a first threshold voltage (e.g., –0.7 volts (V)) and being below a second threshold voltage (e.g., 0.7 V), the diodes 216, 220 are off causing the diodes 216, 220 to operate as open circuits. Thus, the resistance between the first input terminal of the fully differential amplifier 204 and the first output terminal of the fully differential amplifier 204 is a function of the resistance of the resistor 218. In this manner, the gain, frequency of the unity gain crossover point, and frequency of the non-dominant pole for the lossy integrator 200 operates based on the resistance of the example resistor 218.

However, responsive to the non-inverted input voltage exceeding the second threshold voltage, the diode 220 turns on allowing current to flow through the diode 220 and capping the output voltage to prevent the output voltage from exceeding the second threshold voltage. The diode 220 has a small amount of resistance (e.g., about 50 Ohms) when the diode 220 is turned on. Thus, the resistance between the first input terminal of the fully differential amplifier 204 and the first output terminal of the fully differential amplifier 204 is significantly reduced. For example, the resistance of the diode 220 is now connected in parallel with the resistor 218, thereby lowering the overall feedback resistance. Lowering the feedback resistance lowers the gain of the fully differential amplifier 204, decreases the frequency of the unity gain crossover point, and increases the frequency of the non-dominant pole. Accordingly, lowering the feedback resistance increases the frequency between the unity gain crossover point and the non-dominant pole to increase the stability of the bandpass filter 250.

Also, responsive to the non-inverted input voltage falling below the first threshold voltage, the diode 216 turns on allowing current to flow through the diode 216 and capping the output voltage to prevent the output voltage from falling below the first threshold voltage. Because the diode 216 has a small amount of resistance (e.g., about 50 Ohms), the resistance between the first input terminal of the fully differential amplifier 204 and the first output terminal of the fully differential amplifier 204 is significantly reduced because the resistance of the diode 216 is now connected in parallel with the resistor 218, thereby lowering the overall feedback resistance. Lowering the feedback resistance lowers the gain of the fully differential amplifier 204, decreases the frequency of the unity gain crossover point, and increases the frequency of the non-dominant pole. Accordingly, lowering the feedback resistance increases the frequency between the unity gain crossover point and the non-dominant pole to increase the stability of the bandpass filter 250. The diode circuitry 222 works in the same manner to reduce the gain of the fully differential amplifier 204 and move the frequencies of the non-dominant pole and the unity gain crossover point based on an inverted input signal. Also, to achieve symmetry for the inverting and non-inverted input signals, the resistance of the resistor 226 may be the same as the resistance of the resistor 218. However, the resistances of the resistors 218, 226 can be any resistance.

Figure 3:
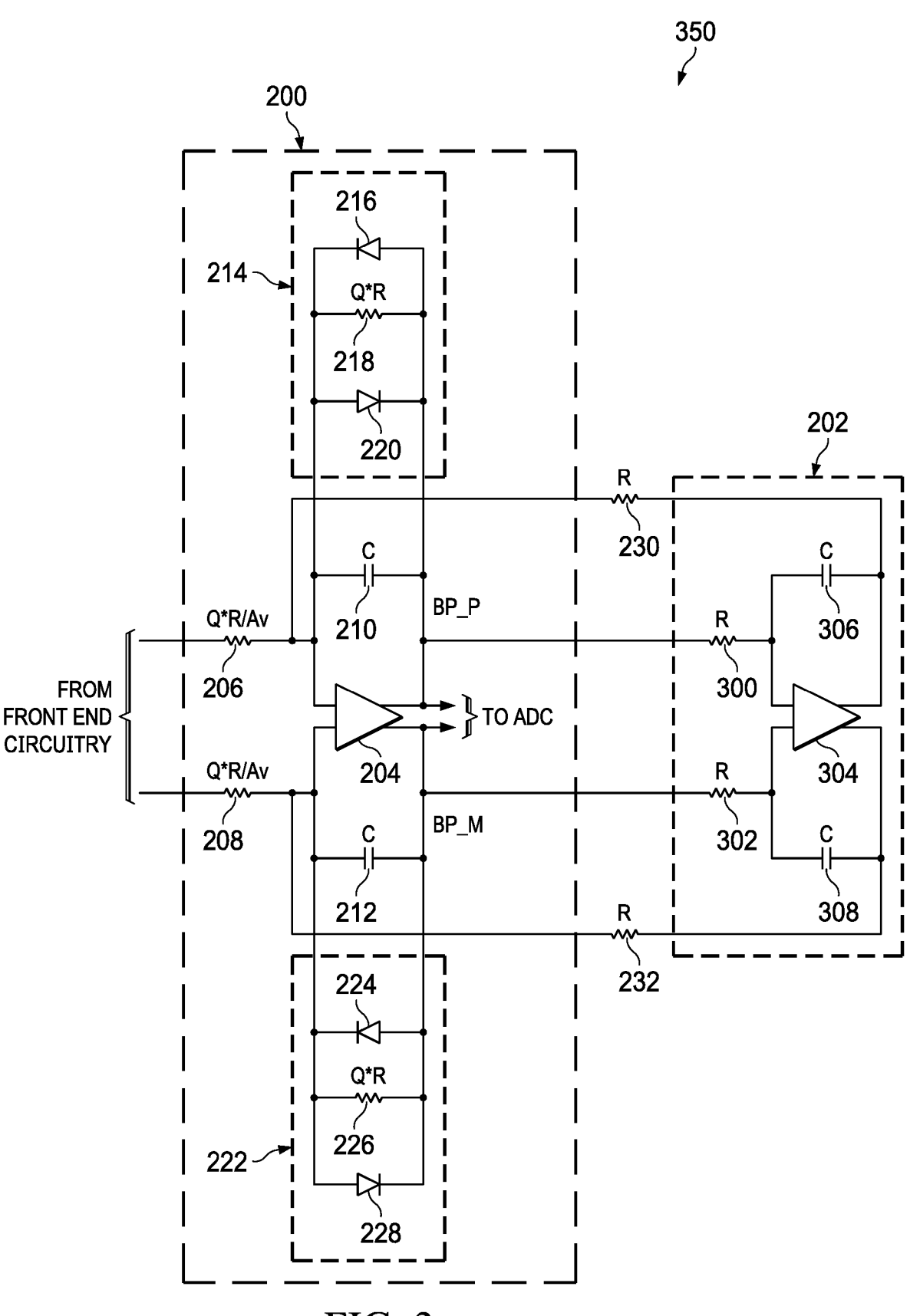
FIG. 3 is an example fully differential circuit implementation of the bandpass filter of FIG. 2.

FIG. 3 illustrates an example bandpass filter 350 for implementing the example bandpass filter 106 of FIG. 2 with a circuit implementation of the lossless integrator 202. The bandpass filter 350 of FIG. 3 includes the example lossy integrator 200 and the example lossless integrator 202 of FIG. 2. The lossy integrator 200 of FIG. 3 includes the example fully differential amplifier 204, the example resistors 206, 208, the example feedback capacitors 210, 212, the example diode circuitry 214, 222, the example diodes 216, 220, 224, 228, and the example resistors 218, 226 of FIG. 2. The example bandpass filter 350 of FIG. 3 further includes the feedback resistors 230, 232 of FIG. 2. The example lossless integrator 202 includes example resistors 300, 302, an example fully differential amplifier 304, and example capacitors 306, 308.

The resistors 300, 302 of FIG. 3 of the lossless integrator 202 are input resistors that receive the output of the fully differential amplifier 204. The first terminal of the resistor 300 is coupled to the anode terminal of the diode 216, the second terminal of the resistor 218, the cathode terminal of the diode 220, the second terminal of the capacitor 210, the first output terminal of the fully differential amplifier 204, and the ADC 108. The second terminal of the resistor 300 is coupled to the first terminal of the capacitor 306 and the first input terminal of the fully differential amplifier 304. The first terminal of the resistor 302 is coupled to the anode terminal of the diode 224, the second terminal of the resistor 226, the cathode terminal of the diode 228, the second terminal of the capacitor 212, the second output terminal of the fully differential amplifier 204, and the ADC 108. The second terminal of the resistor 302 is coupled to the first terminal of the capacitor 308 and the second input terminal of the fully differential amplifier 304. The resistance of the resistors 300, 302 can be selected for a desired gain of the lossless integrator 202.

The fully differential amplifier 304 of FIG. 3 amplifies the output signals of the fully differential amplifier 204. The outputs of the fully differential amplifier 304 are fed back to the inputs of the fully differential amplifier 204 via the respective resistors 230, 232. The fully differential amplifier 304 has two input terminals and two output terminals. The first input terminal of the fully differential amplifier 304 is coupled to the second terminal of the resistor 300 and the first terminal of the capacitor 306. The second input terminal of the fully differential amplifier 304 is coupled to the second terminal of the resistor 302 and the first terminal of the capacitor 308. The first output terminal of the fully differential amplifier 304 is coupled to the second terminal of the capacitor 306 and the second terminal of the resistor 230. The second output terminal of the fully differential amplifier 304 is coupled to the second terminal of the capacitor 308 and the second terminal of the resistor 232.

The capacitors 306, 308 of FIG. 2 are feedback capacitors. The gain of amplifier 204 is a function of the capacitance of the capacitors 306, 308. The first terminal of the capacitor 306 is coupled to the second terminal of the resistor 300 and the first input terminal of the fully differential amplifier 304. The second terminal of the capacitor 306 is coupled to the first output terminal of the fully differential amplifier 304 and the second terminal of the resistor 230. The first terminal of the capacitor 308 is coupled to the second terminal of the resistor 302 and the second input terminal of the fully differential amplifier 304. The second terminal of the capacitor 308 is coupled to the second output terminal of the fully differential amplifier 304 and the second terminal of the resistor 232.

Figure 4:
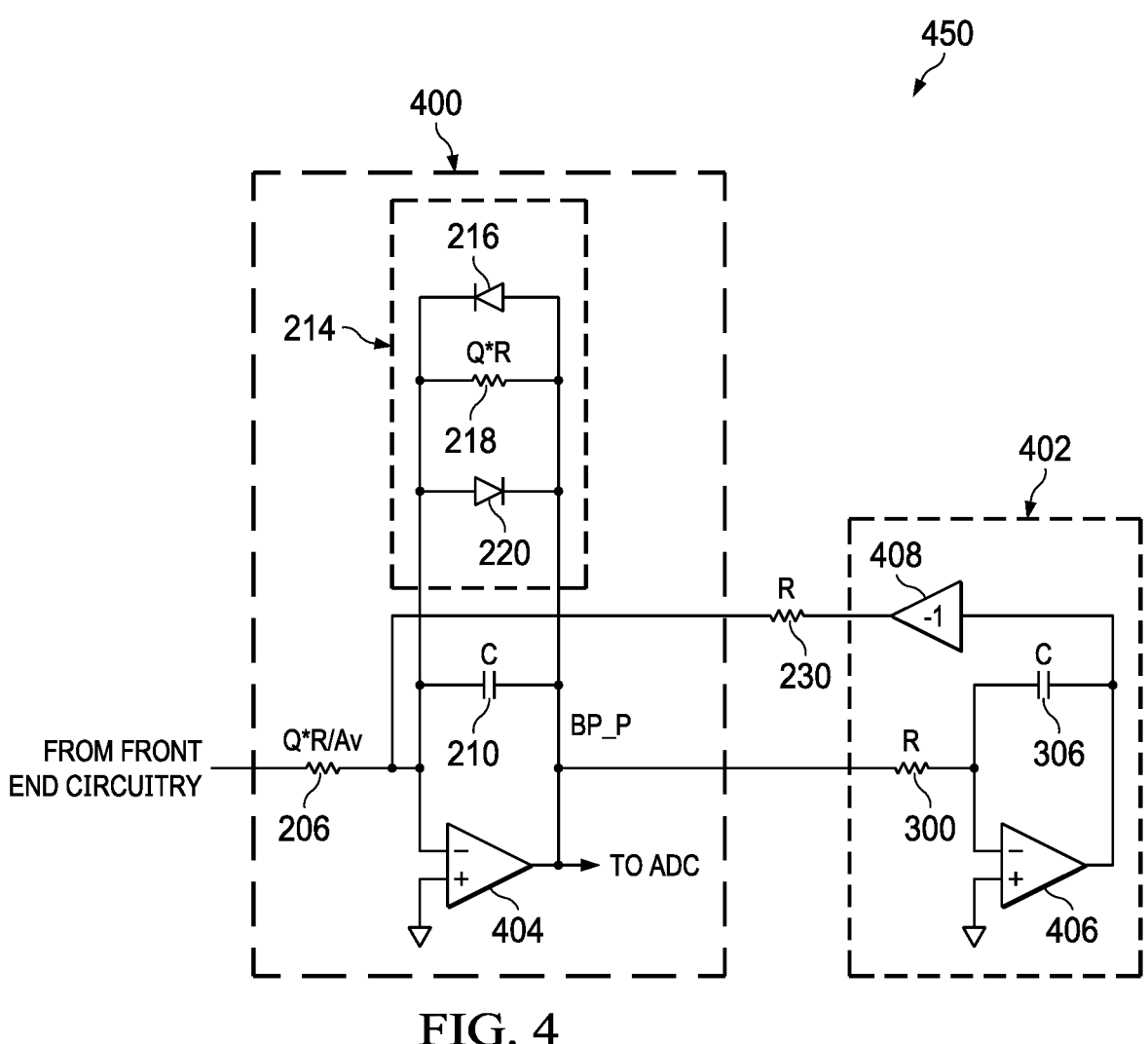
FIG. 4 is an example differential implementation of the bandpass filter of FIG. 1.

FIG. 4 illustrates an example bandpass filter 450 for implementing the example bandpass filter 106 of FIG. 1 with "standard" differential amplifiers, having differential inputs and a single-ended output. The bandpass filter 450 of FIG. 4 includes an example lossy integrator 400 and an example lossless integrator 402. The lossy integrator 400 of FIG. 4 includes the resistors 206, 218, the diode circuitry 214, the diodes 216, 220, and the capacitor 210 of FIGS. 2 and/or 3. The lossy integrator 400 of FIG. 4 further includes a differential amplifier 404. The lossless integrator 402 of FIG. 4 includes the resistor 300 and the capacitor 306 of FIG. 3. The lossless integrator 402 further includes an example differential amplifier 406 and an example inverter 408. The bandpass filter 450 of FIG. 4 further includes the feedback resistor 230 of FIGS. 2 and/or 3.

In the example lossy integrator 400 of FIG. 4, the resistors 206, 218, capacitor 210, diodes circuitry 214, and diodes 216, 220 operate in the same manner as in FIGS. 2 and/or 3. However, in the lossy integrator 400, the fully differential amplifier 204 is replaced with a differential amplifier 404 (e.g., an operational amplifier, an error amplifier, etc.) and only one input signal is received. The differential amplifier 404 has an inverting input terminal, a non-inverting input terminal, and an output terminal. The inverting input terminal of the differential amplifier 404 is coupled to the second terminal of the resistor 206, the first terminal of the resistor 230, the cathode terminal of the diode 216, the first terminal of the resistor 218, the anode terminal of the diode 220, and the first terminal of the capacitor 210. The non-inverting input terminal of the differential amplifier 404 is coupled to ground. The output terminal of the differential amplifier 404 is coupled to the ADC 108, a first input terminal of lossless integrator 202, the anode terminal of the diode 216, the second terminal of the resistor 218, the cathode terminal of the diode 220, and the second terminal of the capacitor 210.

In the example lossless integrator 402 of FIG. 4, the resistor 300 and the capacitor 306 operate in the same manner as in FIG. 3. However, in the lossless integrator 402, the fully differential amplifier 304 is replaced with a differential amplifier 406. The differential amplifier 406 has an inverting input terminal, a non-inverting input terminal, and an output terminal. The inverting input terminal of the differential amplifier 406 is coupled to the second terminal of the resistor 300 and the first terminal of the capacitor 306. The non-inverting input terminal of the differential amplifier 406 is coupled to ground. The output terminal of the differential amplifier 406 is coupled to the second terminal of the capacitor 306 and the input terminal of the inverter 408.

The inverter 408 of FIG. 4 inverts the output of the amplifier 406. The inverter 408 has an input terminal and an output terminal. The input terminal of the inverter 408 is coupled to the second terminal of the capacitor 306 and the output terminal of the amplifier 406. The output terminal of the inverter 408 is coupled to the resistor 230.

Figure 5:
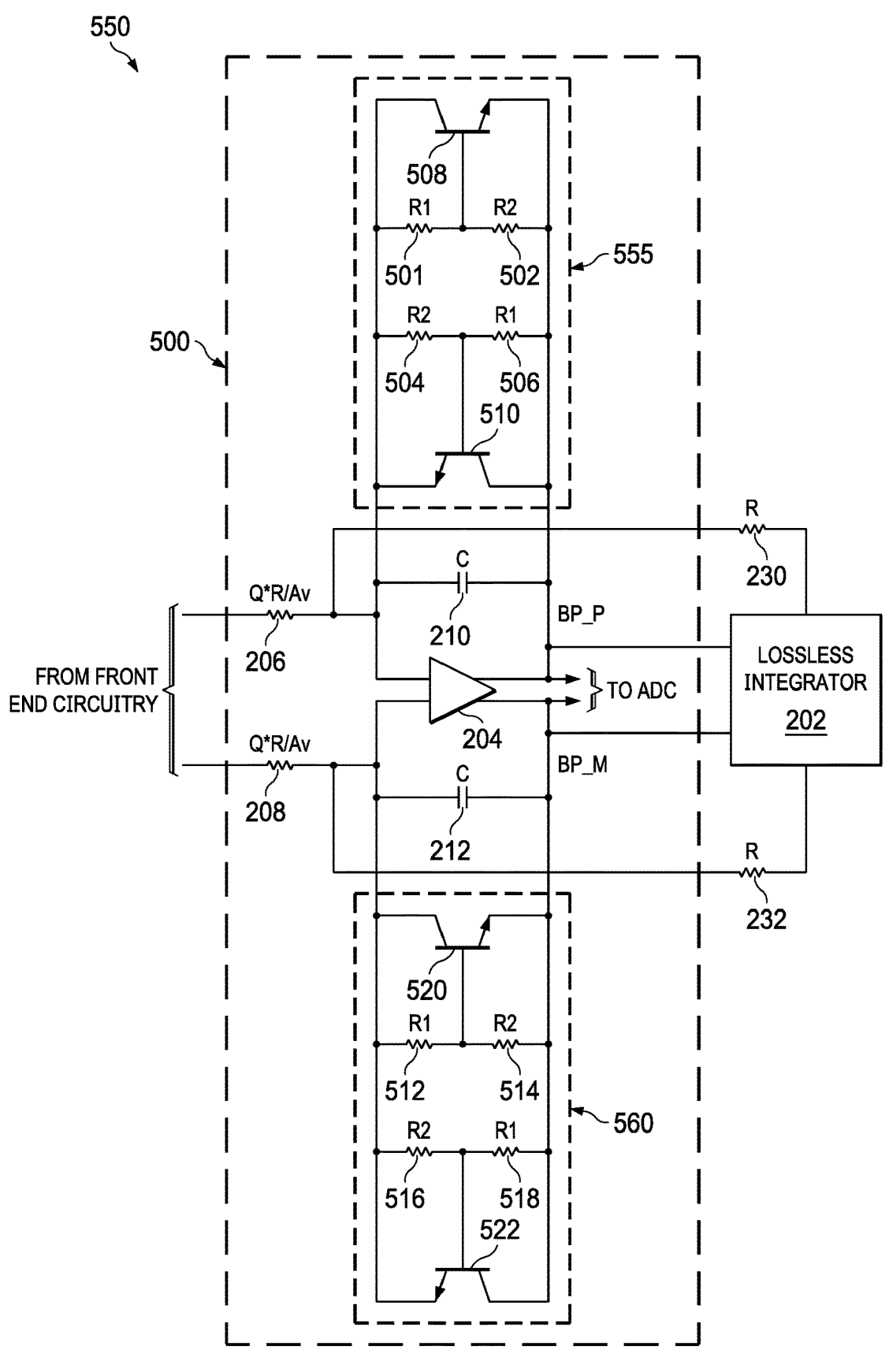
FIG. 5 is an example alternative fully differential implementation of the bandpass filter of FIG. 1.

FIG. 5 illustrates an example bandpass filter 550 for implementing the example bandpass filter 106 of FIG. 1. The bandpass filter 550 of FIG. 5 includes example lossy integrator 500 and the example lossless integrator 202 of FIG. 2. The lossy integrator 500 of FIG. 5 includes the example fully differential amplifier 204, the example resistors 206, 208, and the example feedback capacitors 210, 212 of FIG. 2. The example bandpass filter 550 of FIG. 5 further includes the feedback resistors 230, 232 of FIG. 2. In FIG. 5, example diode circuitry 555, 560 replaces the diodes 216, 220, 224, 228 and the resistors 218, 226 of FIGS. 2-4 with example resistors 501, 502, 504, 506, 512, 514, 516, 518 and example transistors 508, 510, 520, 522.

The resistors 501, 502, 504, 506 of FIG. 5 each have two terminals. The first terminal of the resistor 501 is coupled to the first current terminal of the transistor 508, the first terminal of the resistor 504, the first current terminal of the transistor 510, the first terminal of the capacitor 210, the first terminal of the resistor 230, the second terminal of the resistor 206, and the first input terminal of the fully differential amplifier 204. The second terminal of the resistor 501 is coupled to the first terminal of the resistor 502 and the control terminal of the transistor 508. The first terminal of the resistor 502 is coupled to the second terminal of the resistor 501 and the control terminal of the transistor 508. The second terminal of the resistor 502 is coupled to the second current terminal of the transistor 508, the second terminal of the resistor 506, the second current terminal of the transistor 510, the second terminal of the capacitor 210, the first output terminal of the fully differential amplifier 204, the ADC 108, and the first input terminal of the lossless integrator 202. The first terminal of the resistor 504 is coupled to the first current terminal of the transistor 508, the first terminal of the resistor 501, the first current terminal of the transistor 510, the first terminal of the capacitor 210, the first terminal of the resistor 230, the second terminal of the resistor 206, and the first input terminal of the fully differential amplifier 204. The second terminal of the resistor 504 is coupled to the first terminal of the resistor 506 and the control terminal of the transistor 510. The first terminal of the resistor 502 is coupled to the second terminal of the resistor 504 and the control terminal of the transistor 510. The second terminal of the resistor 502 is coupled to the second current terminal of the transistor 508, the second terminal of the resistor 502, the second current terminal of the transistor 510, the second terminal of the capacitor 210, the first output terminal of the fully differential amplifier 204, the ADC 108, and the first input terminal of the lossless integrator 202.

The transistors 508, 510 of FIG. 5 are bipolar junction transistors (BJTs). However, the transistors 508, 510 can be metal oxide semiconductor field effect transistors (MOS- FETs) and/or any other type of transistor. The transistors 508, 510 each have two "current" terminals (e.g., an emitter terminal and collector terminal) and a control terminal (e.g., a base terminal). The first current terminal of the transistor 508 is coupled to the terminal of the resistor 501, the first terminal of the resistor 504, the first current terminal of the transistor 510, the first terminal of the capacitor 210, the first terminal of the resistor 230, the second terminal of the resistor 206, and the first input terminal of the fully differential amplifier 204. The second current terminal of the transistor 508 is coupled to the second terminal of the resistor 502, the second terminal of the resistor 506, the second current terminal of the transistor 510, the second terminal of the capacitor 210, the first output terminal of the fully differential amplifier 204, the ADC 108, and the first input terminal of the lossless integrator 202. The control terminal of the transistor 508 is coupled to the second terminal of the resistor 501 and the first terminal of the resistor 502. The first current terminal of the transistor 510 is coupled to the terminal of the resistor 501, the first terminal of the resistor 504, the first current terminal of the transistor 508, the first terminal of the capacitor 210, the first terminal of the resistor 230, the second terminal of the resistor 206, and the first input terminal of the fully differential amplifier 204. The second current terminal of the transistor 510 is coupled to the second terminal of the resistor 502, the second terminal of the resistor 506, the second current terminal of the transistor 508, the second terminal of the capacitor 210, the first output terminal of the fully differential amplifier 204, the ADC 108, and the first input terminal of the lossless integrator 202. The control terminal of the transistor 510 is coupled to the second terminal of the resistor 504 and the first terminal of the resistor 506.

The resistors 512, 514, 516, 518 of FIG. 5 each have two terminals. The first terminal of the resistor 512 is coupled to the first current terminal of the transistor 520, the first terminal of the resistor 516, the first current terminal of the transistor 522, the first terminal of the capacitor 212, the first terminal of the resistor 232, the second terminal of the resistor 208, and the second input terminal of the fully differential amplifier 204. The second terminal of the resistor 512 is coupled to the first terminal of the resistor 514 and the control terminal of the transistor 520. The first terminal of the resistor 514 is coupled to the second terminal of the resistor 512 and the control terminal of the transistor 520. The second terminal of the resistor 514 is coupled to the second current terminal of the transistor 520, the second terminal of the resistor 518, the second current terminal of the transistor 522, the second terminal of the capacitor 212, the second output terminal of the fully differential amplifier 204, the ADC 108, and the second input terminal of the lossless integrator 202. The first terminal of the resistor 516 is coupled to the first current terminal of the transistor 520, the first terminal of the resistor 512, the first current terminal of the transistor 522, the first terminal of the capacitor 212, the first terminal of the resistor 232, the second terminal of the resistor 208, and the second input terminal of the fully differential amplifier 204. The second terminal of the resistor 516 is coupled to the first terminal of the resistor 518 and the control terminal of the transistor 522. The first terminal of the resistor 514 is coupled to the second terminal of the resistor 516 and the control terminal of the transistor 522. The second terminal of the resistor 514 is coupled to the second current terminal of the transistor 520, the second terminal of the resistor 514, the second current terminal of the transistor 522, the second terminal of the capacitor 212, the second output terminal of the fully differential amplifier 204, the ADC 108, and the second input terminal of the lossless integrator 202.

The transistors 520, 522 of FIG. 5 are bipolar junction transistors (BJTs). However, the transistors 520, 522 can be metal oxide semiconductor field effect transistors (MOSFETs) and/or any other type of transistor. The transistors 520, 522 each have two current terminals (e.g., an emitter terminal and collector terminal) and a control terminal (e.g., a base terminal). The first current terminal of the transistor 520 is coupled to the terminal of the resistor 512, the first terminal of the resistor 516, the first current terminal of the transistor 522, the first terminal of the capacitor 212, the first terminal of the resistor 232, the second terminal of the resistor 208, and the second input terminal of the fully differential amplifier 204. The second current terminal of the transistor 520 is coupled to the second terminal of the resistor 514, the second terminal of the resistor 518, the second current terminal of the transistor 522, the second terminal of the capacitor 212, the second output terminal of the fully differential amplifier 204, the ADC 108, and the second input terminal of the lossless integrator 202. The control terminal of the transistor 520 is coupled to the second terminal of the resistor 512 and the first terminal of the resistor 514. The first current terminal of the transistor 522 is coupled to the terminal of the resistor 512, the first terminal of the resistor 516, the first current terminal of the transistor 508, the first terminal of the capacitor 212, the first terminal of the resistor 232, the second terminal of the resistor 208, and the second input terminal of the fully differential amplifier 204. The second current terminal of the transistor 522 is coupled to the second terminal of the resistor 514, the second terminal of the resistor 518, the second current terminal of the transistor 520, the second terminal of the capacitor 212, the second output terminal of the fully differential amplifier 204, the ADC 108, and the second input terminal of the lossless integrator 202. The control terminal of the transistor 522 is coupled to the second terminal of the resistor 516 and the first terminal of the resistor 518.

As described above, the diode circuitry 214, 222 includes the diodes 216, 220, 224, 228. The diodes 216, 228 turn on (e.g., to operate as a low impedance short circuit) responsive to the input voltage exceeding a first threshold (e.g., 0.7 V). Also, the diodes 220, 224 turn on responsive to the input voltage falling below a second threshold (e.g., −0.7 V). The thresholds are based on the characteristics of the diode. The example diode circuitry 555, 560 of FIG. 5 operates similarly to the diode circuitry of FIGS. 2-4; however, the threshold voltage at which the transistors turn-on and operate like diodes can be controlled based on, e.g., as a function of, the selected resistor values 501, 502, 504, 506. For example, the transistor 508 operates like a diode, in which the turn-on voltage is based on, e.g., is a function of the resistors 501, 502. Namely, the turn-on voltage is $(1+r1/r2)$ *vbe, where r1 is the resistance of the resistor 501, r2 is the resistance of the resistor 502, and vbe is the base emitter voltage of the transistor 508.

In this manner, a user and/or manufacturer can adjust the turn-on voltage for the transistors 508, 510, 520, 522 to cap the input signal to a maximum value and/or minimum value based on the particular resistances selected for the corresponding resistors 501, 502, 504, 506, 512, 514, 516, 518. Also, the resistances of 501, 502, 504, 506 can be selected so that the total feedback resistance is equal to the resistance of the resistor 218, for example to achieve a desired quality value. Similarly the resistors 512, 514, 516, 518 can be selected to control the turn-on voltage of the respective transistors 520, 522 so that the total feedback resistance is equal to the resistance of the resistor 226, for example to achieve a desired quality value. Also, to achieve symmetry for the inverting and non-inverted input signals, the resistance of the resistor 512 may be the same as the resistance of the resistor 501; the resistance of the resistor 514 may be the same as the resistance of the resistor 502; the resistance of the resistor 516 may be the same as the resistance of the resistor 504; and, the resistance of the resistor 518 may be the same as the resistance of the resistor 506. However, the resistances of the resistors 501, 502, 504, 506, 512, 514, 516, 518 can be any resistance.

Figure 6:
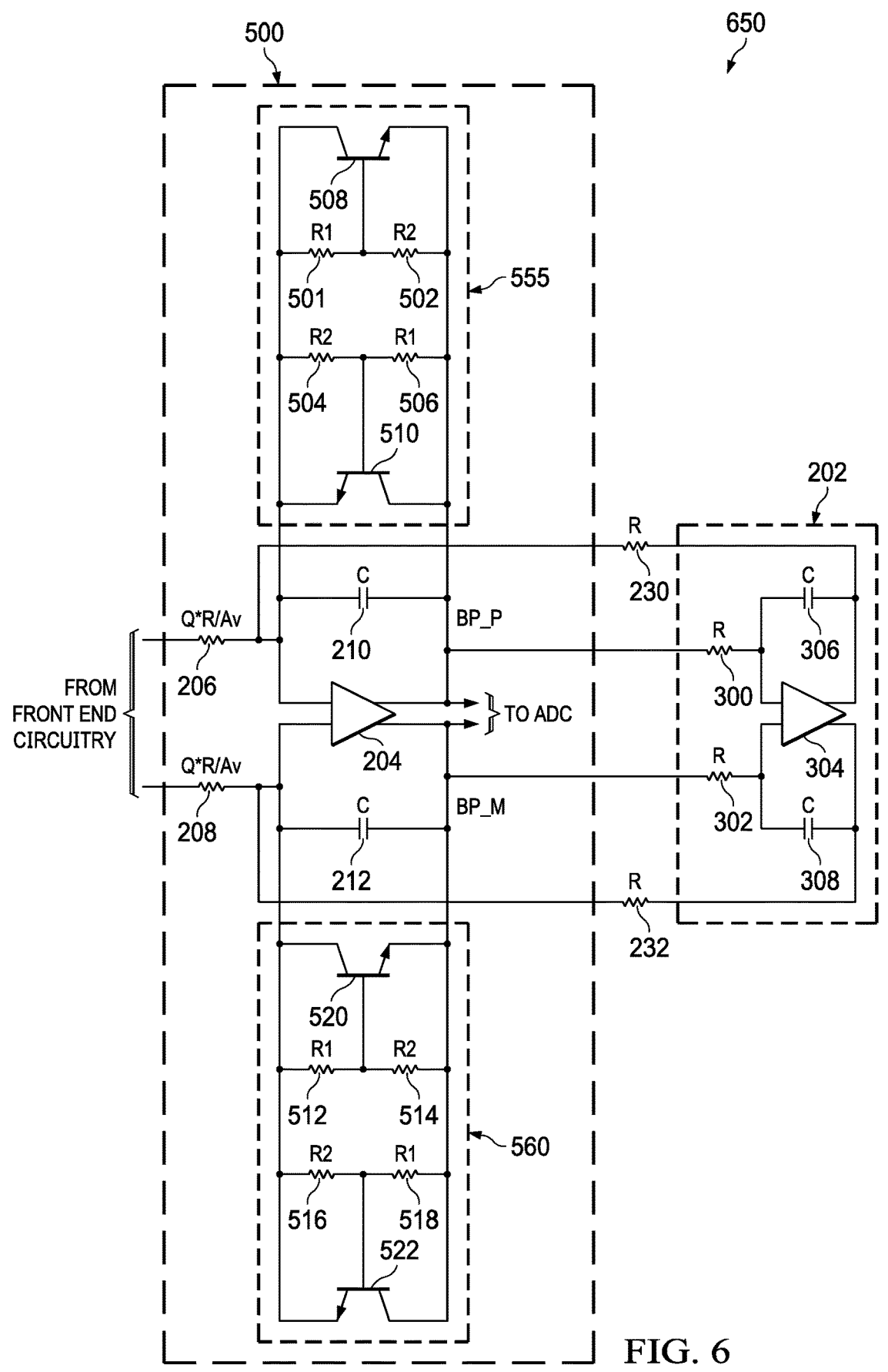
FIG. 6 is an example fully differential circuit implementation of the bandpass filter of FIG. 5.

FIG. 6 illustrates an example bandpass filter 650 for implementing the example bandpass filter 106 of FIG. 5 with a circuit implementation of the lossless integrator 202. The bandpass filter 650 of FIG. 6 includes the example lossy integrator 500 and the example lossless integrator 202 of FIG. 2. The lossy integrator 500 of FIG. 6 includes the example fully differential amplifier 204, the example resistors 206, 208, and the example feedback capacitors 210, 212 of FIG. 2. The lossy integrator 500 further includes the resistors 501, 502, 504, 506, 512, 514, 516, 518 and the transistors 508, 510, 520, 522, and the example diode circuitry 555, 560 of FIG. 5. The example bandpass filter 650 of FIG. 6 further includes the feedback resistors 230, 232 of FIG. 2. The example lossless integrator 202 includes the example resistors 300, 302, the example fully differential amplifier 304, and the example capacitors 306, 308.

Figure 7:
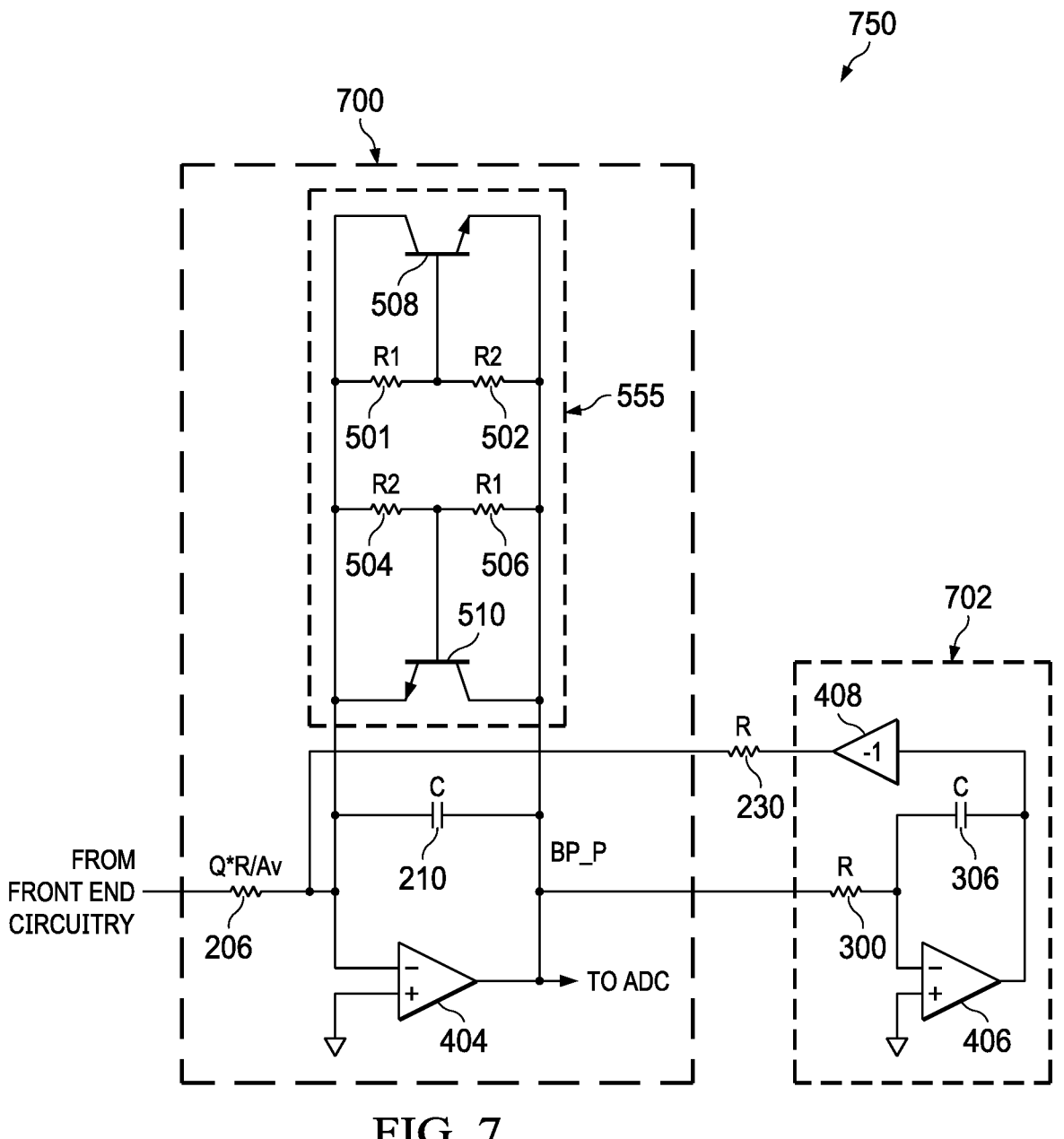
FIG. 7 is an example alternative differential implementation of the bandpass filter of FIG. 1.

FIG. 7 illustrates an example bandpass filter 750 for implementing the example bandpass filter 106 of FIG. 1 with differential amplifiers. The bandpass filter 750 of FIG. 7 includes an example lossy integrator 700 and an example lossless integrator 702. The lossy integrator 700 of FIG. 7 includes the resistors 206, 501, 502, 504, 506, the transistors 508, 510, of FIGS. 5 and/or 6. The lossy integrator 700 of FIG. 7 further includes the differential amplifier 404 of FIG. 4. The lossless integrator 702 of FIG. 7 includes the resistor 300 and the capacitor 306 of FIG. 3. The lossless integrator 702 further includes the differential amplifier 406 and the inverter 408 of FIG. 4. The bandpass filter 750 of FIG. 7 further includes the feedback resistor 230 of FIGS. 2-6.

In the example lossy integrator 700 of FIG. 7, the resistors 206, 501, 502, 504, 506, capacitor 210, diodes circuitry 555, and transistors 508, 510 operate in the same manner as in FIGS. 5 and/or 6. However, in the lossy integrator 700, the fully differential amplifier 204 is replaced with the differential amplifier 404 (e.g., an operational amplifier, an error amplifier, etc.) of FIG. 4 and only one input signal is received. The differential amplifier 404 has an inverting input terminal, a non-inverting input terminal, and an output terminal. The inverting input terminal of the differential amplifier 404 is coupled to the second terminal of the resistor 206, the first terminal of the resistor 230, the first current terminal of the transistor 508, the first terminal of the resistor 501, the first terminal of the resistor 504, the first current terminal of the transistor 510, and the first terminal of the capacitor 210. The non-inverting input terminal of the differential amplifier 404 is coupled to ground. The output terminal of the differential amplifier 404 is coupled to the ADC 108, a first input terminal of lossless integrator 202, the second current terminal of the transistor 508, the second terminal of the resistor 502, the second terminal of the resistor 506, the second current terminal of the transistor 510, and the second terminal of the capacitor 210.

In the example lossless integrator 702 of FIG. 7, the resistor 300 and the capacitor 306 operate in the same manner as in FIGS. 3 and/or 6. However, in the lossless integrator 702, the fully differential amplifier 304 is replaced with the differential amplifier 406. The differential amplifier 406 has an inverting input terminal, a non-inverting input terminal, and an output terminal. The inverting input terminal of the differential amplifier 406 is coupled to the second terminal of the resistor 300 and the first terminal of the capacitor 306. The non-inverting input terminal of the differential amplifier 406 is coupled to ground. The output terminal of the differential amplifier 406 is coupled to the second terminal of the capacitor 306 and the second terminal of the input terminal of the inverter 408.

Figure 8:
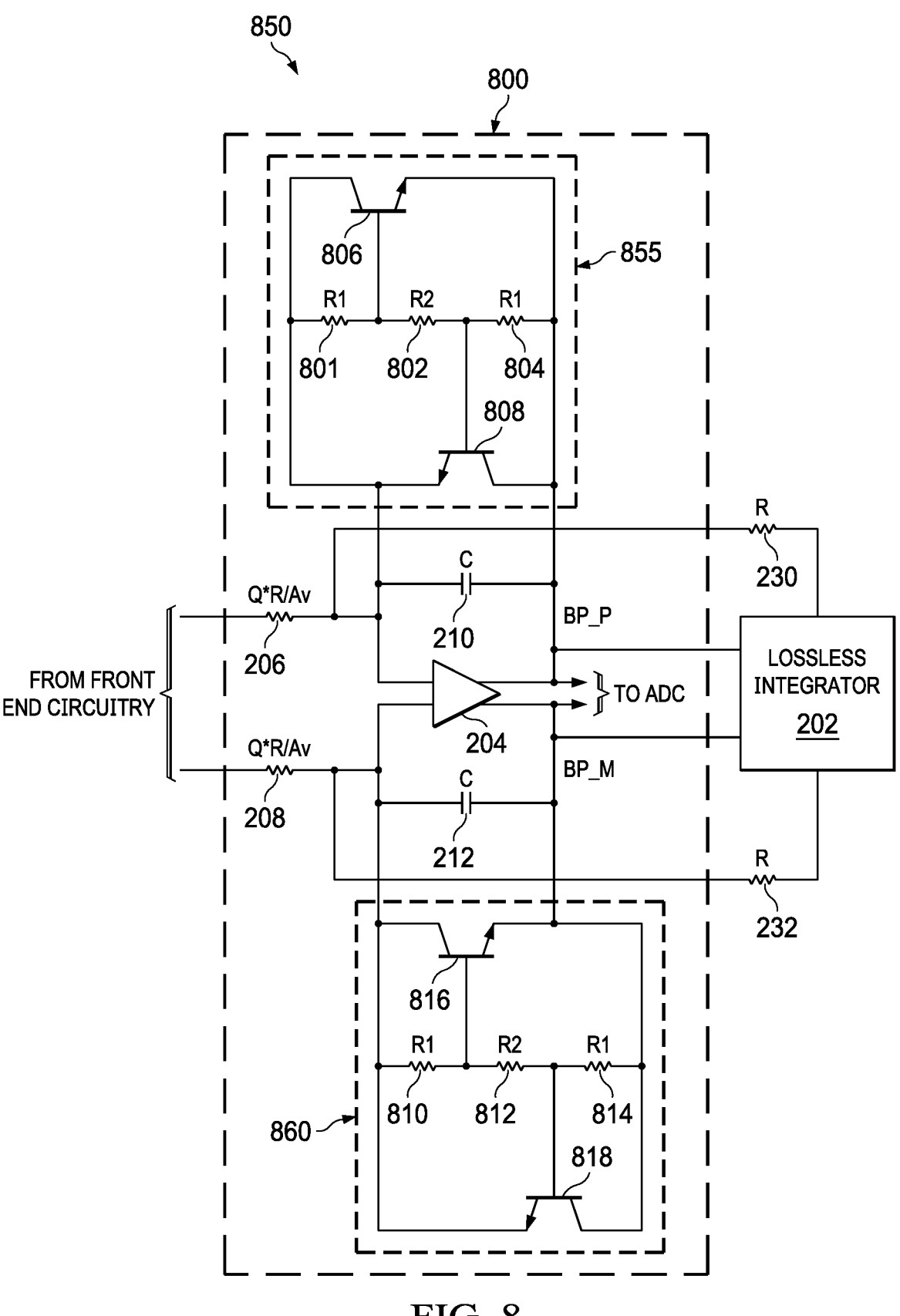
FIG. 8 is an example alternative fully differential implementation of the bandpass filter of FIG. 1.

FIG. 8 illustrates an example bandpass filter 850 for implementing the example bandpass filter 106 of FIG. 1. The bandpass filter 106 of FIG. 8 includes the example lossy integrator 800 and the example lossless integrator 202 of FIG. 2. The lossy integrator 800 of FIG. 8 includes the example fully differential amplifier 204, the example resistors 206, 208, and the example feedback capacitors 210, 212 of FIG. 2. The example bandpass filter 850 of FIG. 3 further includes the feedback resistors 230, 232 of FIG. 2. In FIG. 8, example diode circuitry 855, 860 replaces the diodes 216, 220, 224, 228 and the resistors 218, 226 of FIGS. 2-4 and/or the example resistors 501, 502, 504, 506, 512, 514, 516, 518 and transistors 508, 510, 520, 522 of FIGS. 5-7 with example resistors 801, 802, 804, 810, 812, 814, and example transistors 806, 808, 816, 818.

The resistors 801, 802, 804 of FIG. 8 each have two terminals. The first terminal of the resistor 801 is coupled to the first current terminal of the transistor 806, the first current terminal of the transistor 808, the first terminal of the capacitor 210, the first terminal of the resistor 230, the second terminal of the resistor 206, and the first input terminal of the fully differential amplifier 204. The second terminal of the resistor 801 is coupled to the first terminal of the resistor 802 and the control terminal of the transistor 806. The first terminal of the resistor 802 is coupled to the second terminal of the resistor 801 and the control terminal of the transistor 806. The second terminal of the resistor 802 is coupled to the first terminal of the resistor 804 and the control terminal of transistor 808. The first terminal of the resistor 804 is coupled to the second terminal of the resistor 802 and the current terminal of the transistor 808. The second terminal of the resistor 804 is coupled to the second current terminal of the transistor 806, the second current terminal of the transistor 808, the second terminal of the capacitor 210, the first output terminal of the fully differential amplifier 204, the ADC 108, and the first input terminal of the lossless integrator 202.

The transistors 806, 808 of FIG. 8 are bipolar junction transistors (BJTs). However, the transistors 806, 808 can be metal oxide semiconductor field effect transistors (MOSFETs) and/or any other type of transistor. The transistors 806, 808 each have two current terminals (e.g., an emitter terminal and collector terminal) and a control terminal (e.g., a base terminal). The first current terminal of the transistor 806 is coupled to the terminal of the resistor 801, the first current terminal of the transistor 808, the first terminal of the capacitor 210, the first terminal of the resistor 230, the second terminal of the resistor 206, and the first input terminal of the fully differential amplifier 204. The second current terminal of the transistor 806 is coupled to the second terminal of the resistor 804, the second current terminal of the transistor 808, the second terminal of the capacitor 210, the first output terminal of the fully differential amplifier 204, the ADC 108, and the first input terminal of the lossless integrator 202. The control terminal of the transistor 806 is coupled to the second terminal of the resistor 801 and the first terminal of the resistor 802. The first current terminal of the transistor 808 is coupled to the terminal of the resistor 801, the first current terminal of the transistor 806, the first terminal of the capacitor 210, the first terminal of the resistor 230, the second terminal of the resistor 206, and the first input terminal of the fully differential amplifier 204. The second current terminal of the transistor 808 is coupled to the second terminal of the resistor 804, the second current terminal of the transistor 806, the second terminal of the capacitor 210, the first output terminal of the fully differential amplifier 204, the ADC 108, and the first input terminal of the lossless integrator 202. The control terminal of the transistor 808 is coupled to the second terminal of the resistor 804 and the first terminal of the resistor 802.

The resistors 810, 812, 814 of FIG. 8 each have two terminals. The first terminal of the resistor 810 is coupled to the first current terminal of the transistor 816, the first current terminal of the transistor 818, the first terminal of the capacitor 212, the first terminal of the resistor 232, the second terminal of the resistor 208, and the second input terminal of the fully differential amplifier 204. The second terminal of the resistor 810 is coupled to the first terminal of the resistor 812 and the control terminal of the transistor 816. The first terminal of the resistor 812 is coupled to the second terminal of the resistor 810 and the control terminal of the transistor 816. The second terminal of the resistor 812 is coupled to the first terminal of the resistor 814 and the control terminal of transistor 818. The first terminal of the resistor 814 is coupled to the second terminal of the resistor 812 and the current terminal of the transistor 818. The second terminal of the resistor 814 is coupled to the second current terminal of the transistor 816, the second current terminal of the transistor 818, the second terminal of the capacitor 212, the second output terminal of the fully differential amplifier 204, the ADC 108, and the second input terminal of the lossless integrator 202.

The transistors 816, 818 of FIG. 8 are bipolar junction transistors (BJTs). However, the transistors 816, 818 can be metal oxide semiconductor field effect transistors (MOS-FETs) and/or any other type of transistor. The transistors 816, 818 each have two current terminals (e.g., an emitter terminal and collector terminal) and a control terminal (e.g., a base terminal). The first current terminal of the transistor 816 is coupled to the terminal of the resistor 810, the first current terminal of the transistor 818, the first terminal of the capacitor 212, the first terminal of the resistor 232, the second terminal of the resistor 208, and the second input terminal of the fully differential amplifier 204. The second current terminal of the transistor 816 is coupled to the second terminal of the resistor 814, the second current terminal of the transistor 818, the second terminal of the capacitor 212, the second output terminal of the fully differential amplifier 204, the ADC 108, and the second input terminal of the lossless integrator 202. The control terminal of the transistor 816 is coupled to the second terminal of the resistor 810 and the first terminal of the resistor 812. The first current terminal of the transistor 818 is coupled to the terminal of the resistor 810, the first current terminal of the transistor 816, the first terminal of the capacitor 212, the first terminal of the resistor 232, the second terminal of the resistor 208, and the second input terminal of the fully differential amplifier 204. The second current terminal of the transistor 818 is coupled to the second terminal of the resistor 814, the second current terminal of the transistor 816, the second terminal of the capacitor 212, the second output terminal of the fully differential amplifier 204, the ADC 108, and the second input terminal of the lossless integrator 202. The control terminal of the transistor 818 is coupled to the second terminal of the resistor 814 and the first terminal of the resistor 812.

As described above, the diode circuitry 214, 222 includes the diodes 216, 220, 224, 228 of FIGS. 2-4 that turn on (e.g., to operate as a low impedance short circuit) responsive to the input voltage exceeding a first threshold (e.g., 0.7 V) or below a second threshold (e.g., −0.7 V). The thresholds are based on the characteristics of the diode. As described in FIGS. 5-7, the resistors 501, 502, 504, 506, 512, 514, 516, 518 and the transistors 508, 510, 520, 522 operate in the same manner as the diode circuitry 214, 222 of FIGS. 2-4 where the turn-on voltage can be selected based on the values of the resistances of the resistors 501, 502, 504, 506, 512, 514, 516, 518. The example diode circuitry 855, 860 of FIG. 8 operates in the same manner as the diode circuitry 555, 560 of FIGS. 5-7. However, the diode circuitry 855, 860 includes one less transistor. Accordingly, the transistor 806 operates like a diode where the turn-on voltage is based on the resistors 801, 802, 804. For example, the turn-on voltage is $(1+r1/(r3+r2))*vbe$, where r1 is the resistance of the resistor 801, r2 is the resistance of the resistor 802, r3 is the resistance of the resistor 804, and vbe is the base emitter voltage of the transistor 806. Also, the transistor 808 operates like a diode where the turn-on voltage is based on the resistance of the resistors 801, 802, 804. For example, the turn-on voltage is $(1+r3/(r1+r2))*vbe$, where r1 is the resistance of the resistor 801, r2 is the resistance of the resistor 802, r3 is the resistance of the resistor 804, and vbe is the base emitter voltage of the transistor 806.

In this manner, a user and/or manufacturer can adjust the turn-on voltage to cap the input signal to a maximum value and/or a minimum value based on the particular resistances selected for the resistors 801, 802, 804, 810, 812, 814. In the example of FIG. 8 the resistances of the resistor 801 and the resistor 804 are the same for symmetry, for example so that the turn-on voltage of the transistor 806 is the opposite of the turn-on voltage of the transistor 808. However, the resistances of the resistors 801, 802, 804 can be selected to be any resistance. Also, the resistances of 801, 802, 804 can be selected so that the total feedback resistance is equal to the resistance of the resistor 218, for example the sum of the resistances of the resistors 801, 802, 804 is equal to the resistance of the resistor 218 of FIG. 2 to achieve a desired quality value. Similarly the resistors 810, 812, 814 can be selected to control the turn-on voltage of the respective transistors 816, 818 and so that the total feedback resistance is equation to the resistance of the resistor 226, for example to achieve a desired quality value. Also, to achieve symmetry for the inverting and non-inverted input signals, the resistance of the resistor 810 may be the same as the resistance of the resistor 801, the resistance of the resistor 812 may be the same as the resistance of the resistor 802, and the resistance of the resistor 814 may be the same as the resistance of the resistor 804. However, the resistances of the resistors 801, 802, 804, 810, 812, 814 can be any resistance.

Figure 9:
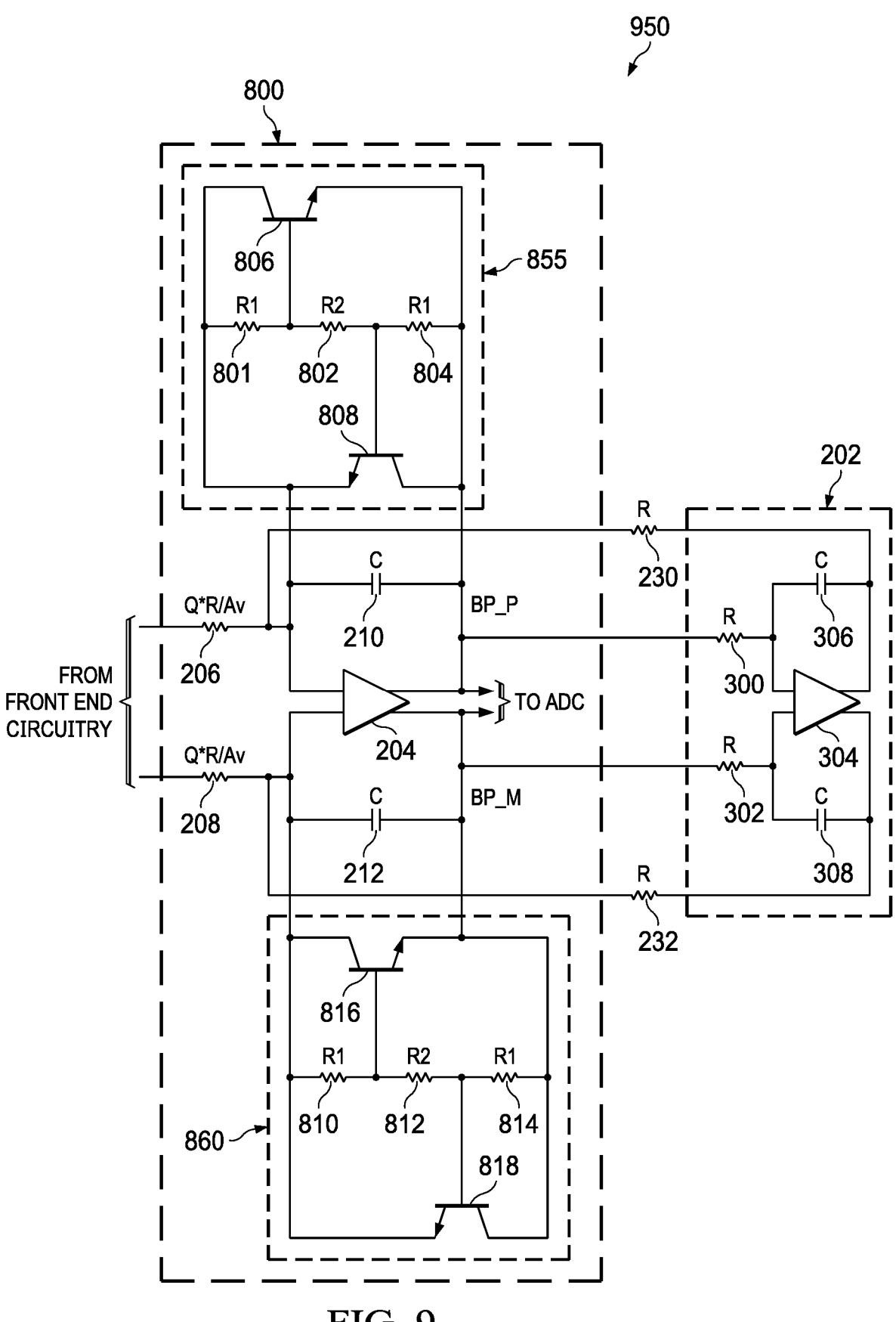
FIG. 9 is an example fully differential circuit implementation of the bandpass filter of FIG. 8.

FIG. 9 illustrates an example bandpass filter 950 for implementing the example bandpass filter 106 of FIG. 8 with a circuit implementation of the lossless integrator 202. The bandpass filter 950 of FIG. 9 includes the example lossy integrator 800 of FIG. 8 and the example lossless integrator 202 of FIG. 2. The lossy integrator 800 of FIG. 9 includes the example fully differential amplifier 204, the example resistors 206, 208, and the example feedback capacitors 210, 212 of FIG. 2. The lossy integrator 800 further includes the resistors 801, 802, 804, 810, 812, 814 and the transistors 806, 808, 816, 818, and the example diode circuitry 855, 860 of FIG. 8. The example bandpass filter 950 of FIG. 9 further includes the feedback resistors 230, 232 of FIG. 2. The example lossless integrator 202 includes the example resistors 300, 302, the example fully differential amplifier 304, and the example capacitors 306, 308.

Figure 10:
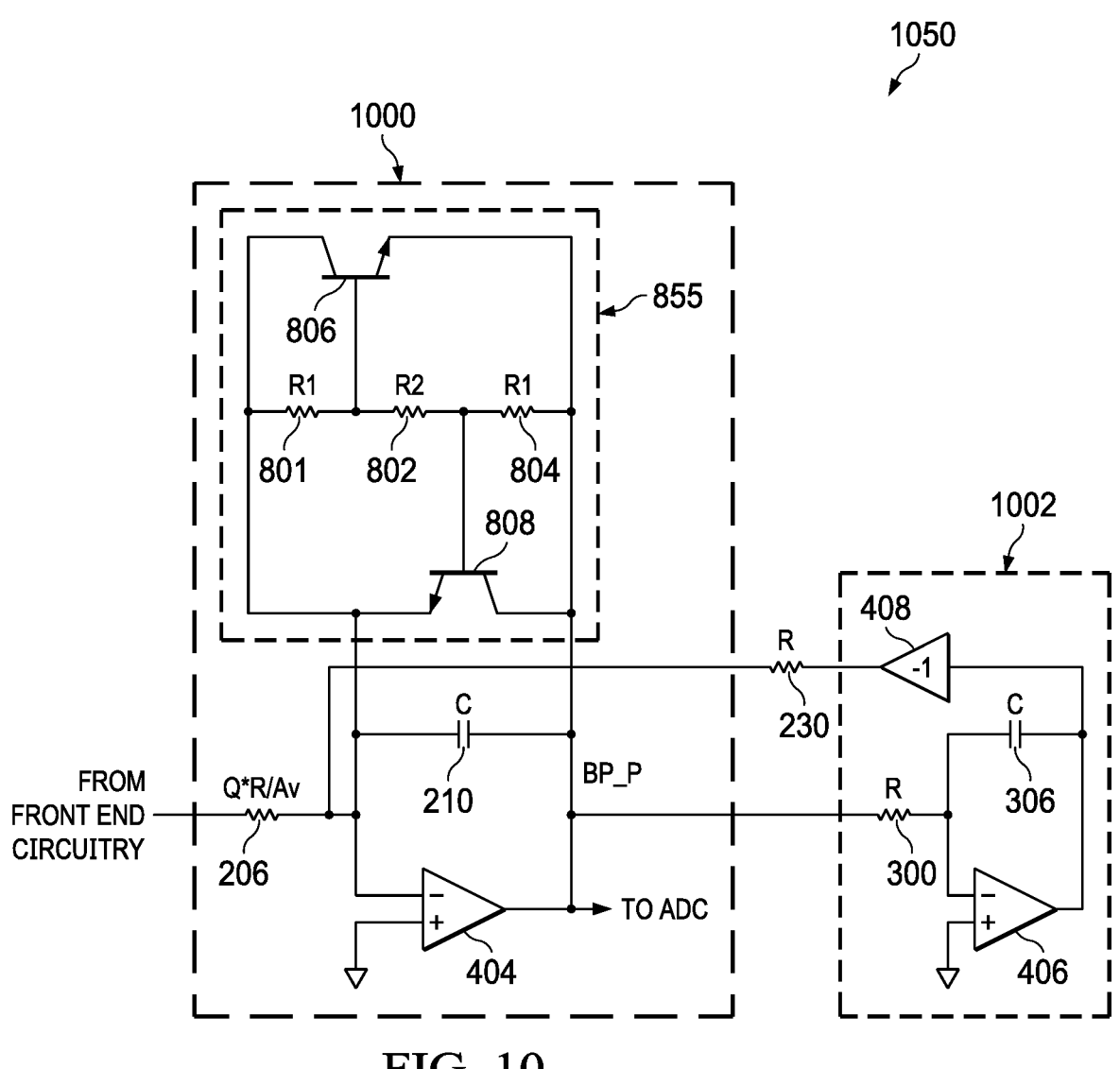
FIG. 10 is an example alternative differential implementation of the bandpass filter of FIG. 1.

FIG. 10 illustrates an example bandpass filter 1050 the example bandpass filter 106 of FIG. 1 with differential amplifiers. The bandpass filter 1050 of FIG. 10 includes an example lossy integrator 1000 and an example lossless integrator 1002. The lossy integrator 1000 of FIG. 10 includes the resistors 206, 801, 802, 804, the transistors 806, 808, of FIGS. 8 and/or 9. The lossy integrator 1000 of FIG. 10 further includes the differential amplifier 404 of FIG. 4. The lossless integrator 1002 of FIG. 10 includes the resistor 300 and the capacitor 306 of FIG. 3. The lossless integrator 1002 further includes the differential amplifier 406 and the inverter 408 of FIG. 4. The bandpass filter 1050 of FIG. 10 further includes the feedback resistor 230 of FIGS. 2-9.

In the example lossy integrator 1000 of FIG. 10, the resistors 206, 801, 802, 804, capacitor 210, diodes circuitry 855, and transistors 806, 808 operate in the same manner as in FIGS. 8 and/or 9. However, in the lossy integrator 1000, the fully differential amplifier 204 is replaced with the differential amplifier 404 (e.g., an operational amplifier, an error amplifier, etc.) of FIG. 4 and only one input signal is received. The differential amplifier 404 has an inverting input terminal, a non-inverting input terminal, and an output terminal. The inverting input terminal of the differential amplifier 404 is coupled to the second terminal of the resistor 206, the first terminal of the resistor 230, the first current terminal of the transistor 806, the first terminal of the resistor 801, the first current terminal of the transistor 808, and the first terminal of the capacitor 210. The non-inverting input terminal of the differential amplifier 404 is coupled to ground. The output terminal of the differential amplifier 404 is coupled to the ADC 108, a first input terminal of lossless integrator 202, the second current terminal of the transistor 806, the second terminal of the resistor 804, the second current terminal of the transistor 808, and the second terminal of the capacitor 210.

In the example lossless integrator 1002 of FIG. 10, the resistor 300 and the capacitor 306 operate in the same manner as in FIGS. 3, 6, and/or 9. However, in the lossless integrator 1002, the fully differential amplifier 304 is replaced with the differential amplifier 406. The differential amplifier 406 has an inverting input terminal, a non-inverting input terminal, and an output terminal. The inverting input terminal of the differential amplifier 406 is coupled to the second terminal of the resistor 300 and the first terminal of the capacitor 306. The non-inverting input terminal of the differential amplifier 406 is coupled to ground. The output terminal of the differential amplifier 406 is coupled to the second terminal of the capacitor 306 and the input terminal of the inverter 408.

Figure 11:
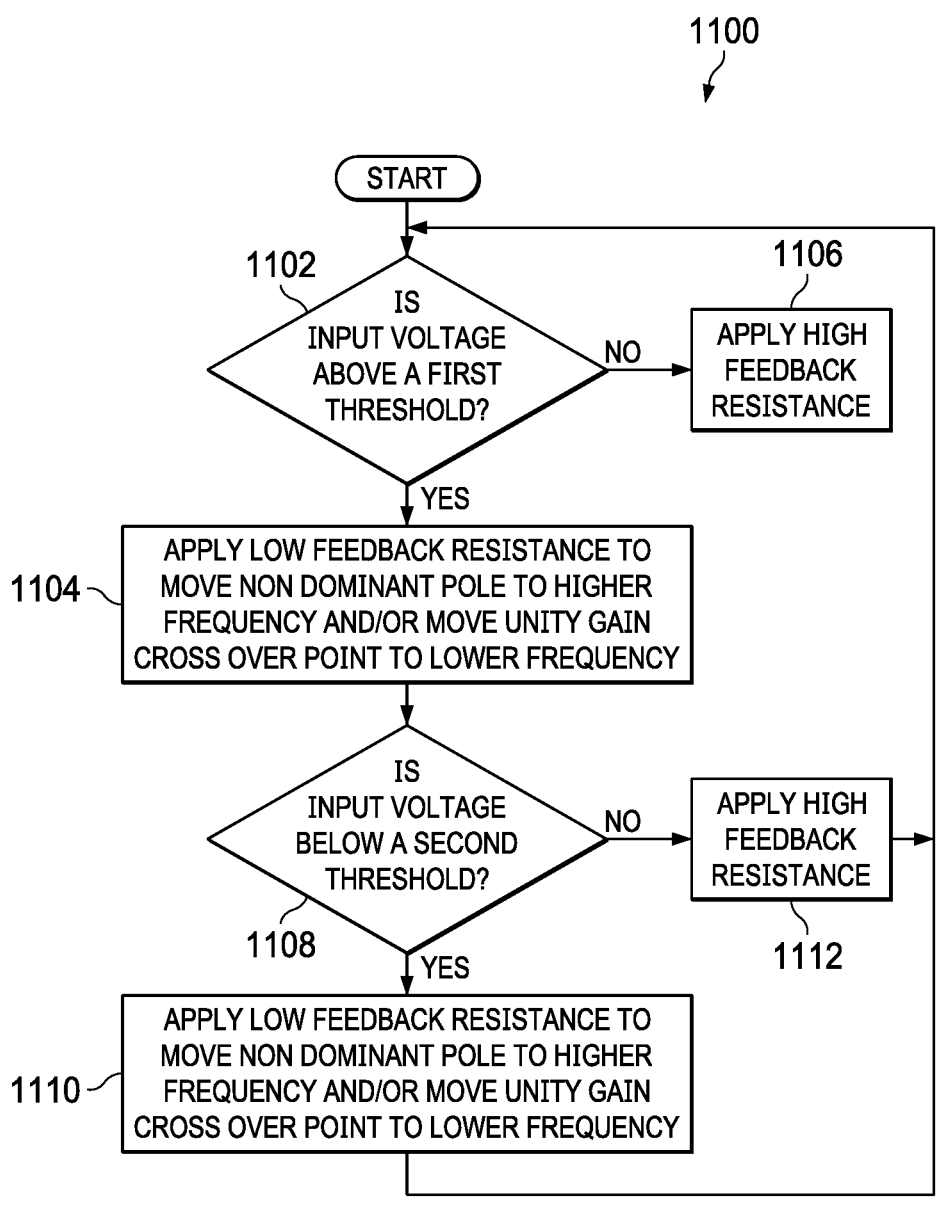
FIG. 11 is a flowchart representative of a method and/or operations that may be executed by a bandpass filter of FIGS. 1, 2, 3, 4, 5, 6, 7, 8, 9, and/or 10.

FIG. 11 is a flowchart representative of a method and/or example operations 1100 that may be performed by circuitry of the bandpass filter 106, 250, 350, 450, 550, 650, 750, 850, 950, 1050 of FIGS. 1, 2, 3, 4, 5, 6, 7, 8, 9, and/or 10. Although the operations of FIG. 11 are described in conjunction with the bandpass filter 106 in the image scanning machine 100 of FIG. 1, the operations may be described in conjunction with any of the bandpass filters 250, 350, 450, 550, 650, 750, 850, 950, 1050 of FIGS. 2-10, a standalone bandpass filter and/or a bandpass filter included in any type of circuitry, device, and/or system.

The operations 1100 of FIG. 11 begin at block 1102, at which the diode circuitry 214, 222, 555, 560, 855, 860 of any one of FIGS. 2-10 is used to determine if the input voltage is above a first threshold. As described above, the first threshold corresponds to a turn-on voltage and may be based on the characteristics of the diode(s) 220, 228 and/or based on the resistance(s) of the resistor(s) 501, 502, 512, 514, 801, 802, 804, 810, 812, 814. If the input voltage is above the first threshold voltage (block 1102: YES), the diode circuitry 214, 222, 555, 560, 855, 860 applies a low feedback resistance to move the non-dominant pole to a higher frequency and/or move the unity gain crossover point to a lower frequency (block 1104). For example, the diode(s) 220, 228 and/or the transistors 508, 520 turn on to operate as a low impedance short circuit. Responsive to the diode(s) 220, 228 and/or the transistors 508, 520 being on, the resistance of low impedance path and the resistance of the resistor(s) 218, 226, 501, 502, 504, 506, 512, 514, 516, 518, 801, 802, 804, 810, 812, 814 are in parallel, thereby reducing the feedback resistance. As described above, lowering the feedback resistance decreases the gain of the lossy amplifier 200, 400, 500, 700, 800, 1000, moves the non-dominant pole to a higher frequency, and/or moves the unity gain crossover point to a lower frequency. Moving the frequencies of the non-dominant pole and the unity gain crossover point increases the stability of the bandpass filter 106.

If the input voltage is not above the first threshold voltage (block 1102: NO), the diode circuitry 214, 222, 555, 560, 855, 860 applies a high feedback resistance that corresponds to the resistance of the resistors 218, 226, 501, 502, 504, 506, 512, 514, 516, 518, 801, 802, 804, 810, 812, 814 (block 1106).

At block 1106, the diode circuitry 214, 222, 555, 560, 855, 860 of any one of FIGS. 2-10 is used to determine if the input voltage is below a second threshold. As described above, the second threshold corresponds to a turn-on voltage and may be based on the characteristics of the diode(s) 216, 224 and/or based on the resistance(s) of the resistor(s) 504, 506, 516, 518, 801, 802, 804, 810, 812, 814. If the input voltage is below the second threshold voltage (block 1106: YES), the diode circuitry 214, 222, 555, 560, 855, 860 applies a low feedback resistance to move the non-dominant pole to a higher frequency and/or move the unity gain crossover point to a lower frequency (block 1108). For example, the diode(s) 216, 224 and/or the transistors 510, 522 turn on to operate as a low impedance short circuit. Responsive to the diode(s) 216, 224 and/or the transistors 510, 522 being on, the resistance of low impedance path and the resistance of the resistor(s) 218, 226, 501, 502, 504, 506, 512, 514, 516, 518, 801, 802, 804, 810, 812, 814 are in parallel, thereby reducing the feedback resistance. As described above, lowering the feedback resistance decreases the gain of the lossy amplifier 200, 400, 500, 700, 800, 1000, moves the non-dominant pole to a higher frequency, and/or moves the unity gain crossover point to a lower frequency. Moving the frequencies of the non-dominant pole and the unity gain crossover point increases the stability of the bandpass filter 106. After block 1108, control returns to block 1102.

If the input voltage is not below the second threshold voltage (block 1108: NO), the diode circuitry 214, 222, 555, 560, 855, 860 applies a high feedback resistance that corresponds to the resistance of the resistors 218, 226, 501, 502, 504, 506, 512, 514, 516, 518, 801, 802, 804, 810, 812, 814 (block 1112). After block 1112, control returns to block 1102.

Figure 12:
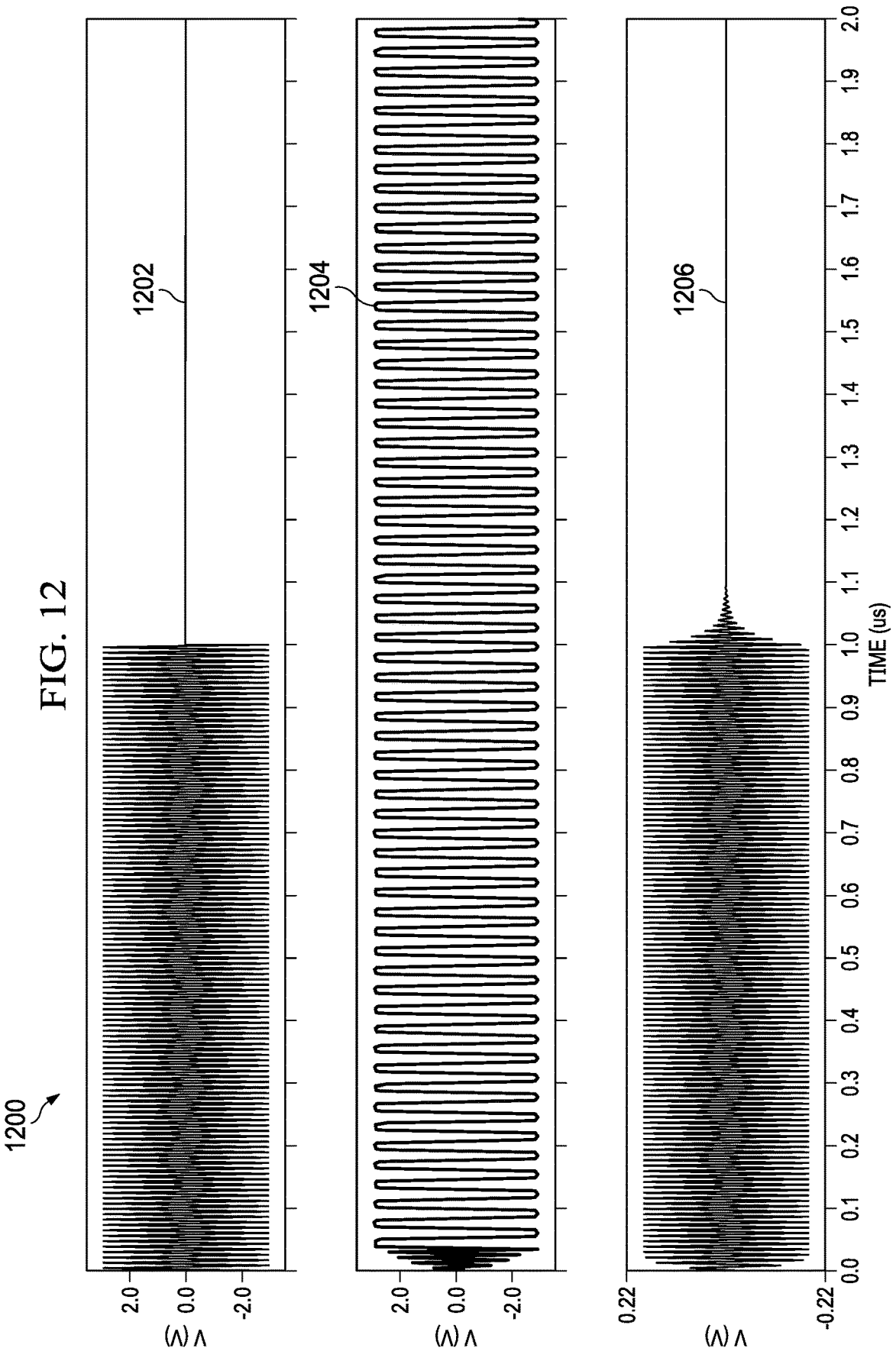
FIG. 12 is an example timing diagram described in conjunction with examples described herein.

FIG. 12 is an example timing diagram 1200 that illustrates an example overloaded input signal 1202, an example bandpass filter output 1204 without the diode circuitry 214, 222, 555, 560, 855, 860 of FIGS. 2-10, and an example bandpass filter output 1206 with the diode circuitry 214, 222, 555, 560, 855, 860 of any one of FIGS. 2-10.

The example overloaded input signal 1202 initiates with a signal that is 4 times the amplitude of what is expected from the output of the front end amplifying state circuitry 104. The overload input signal 1202 then reduces to a manageable amplitude. As shown in the example bandpass filter output 1204, the output signal oscillates due to the overloaded input signal 1202 and does not recover even after the overloaded input signal 1202 reduces to a manageable amplitude. Thus, a bandpass filter without the diode circuitry 214, 222, 555, 560, 855, 860 is an unstable system responsive to the overloaded input signal 1202 being applied to the corresponding bandpass filter. As shown in the example bandpass filter output 1206, the output signal oscillates in conjunction with the overloaded input signal 1202 and recovers after the overloaded input signal 1202 reduces to a manageable amplitude. Thus, a bandpass filter 106 described herein with the diode circuitry 214, 222, 555, 560, 855, 860 is stable system responsive to the overloaded input signal 1202 being applied.

An example manner of implementing the bandpass filter 106 of FIG. 1 is illustrated in FIG. 2. However, one or more of the elements, processes and/or devices illustrated in FIG. 2-10 may be combined, divided, re-arranged, omitted, eliminated and/or implemented in any other way.

Further, the components of FIGS. 2-10 may include one or more elements, processes and/or devices in addition to, or instead of, those illustrated in FIGS. 2-10, and/or may include more than one of any or all of the illustrated elements, processes, and devices. As used herein, the phrase "in communication," including variations thereof, encompasses direct communication and/or indirect communication through one or more intermediary components, and does not require direct physical (e.g., wired) communication and/or constant communication, but rather also includes selective communication at periodic intervals, scheduled intervals, aperiodic intervals, and/or one-time events.

Further, although the example operations are described with reference to the flowchart illustrated in FIG. 11, many other methods of implementing the bandpass filters 106, 250, 350, 450, 550, 650, 750, 850, 950, 1050 may alternatively be used. For example, the order of the blocks may be changed, and/or some of the blocks described may be changed, eliminated, or combined.

Descriptors "first," "second," "third," etc. are used herein when identifying multiple elements or components which may be referred to separately. Unless otherwise specified or understood based on their context of use, such descriptors do not impute any meaning of priority, physical order, or arrangement in a list, or ordering in time but are merely used as labels for referring to multiple elements or components separately for ease of understanding the described examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

In the description and in the claims, the terms "including" and "having," and variants thereof are intended to be inclusive in a manner similar to the term "comprising" unless otherwise noted. Unless otherwise stated, "about," "approximately," or "substantially" preceding a value means within +/−10 percent of the stated value. In another example, "about," "approximately," or "substantially" preceding a value means within +/−5 percent of the stated value. In another example, "about," "approximately," or "substantially" preceding a value means within +/−1 percent of the stated value.

The term "couple" "coupled", "couples", and variants thereof, as used herein, may cover connections, communications, or signal paths that enable a functional relationship consistent with this description. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A. Moreover, the terms "couple," "coupled", "couples", or variants thereof, includes an indirect or direct electrical or mechanical connection.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

Although not all separately labeled in the FIGS., components or elements of systems and circuits illustrated therein have one or more conductors or terminus that allow signals into and/or out of the components or elements. The conductors or terminus (or parts thereof) may be referred to herein as pins, pads, terminals (including input terminals, output terminals, reference terminals, and ground terminals, for instance), inputs, outputs, nodes, and interconnects.

As used herein, a "terminal" of a component, device, system, circuit, integrated circuit, or other electronic or semiconductor component, generally refers to a conductor such as a wire, trace, pin, pad, or other connector or interconnect that enables the component, device, system, etc., to electrically and/or mechanically connect to another component, device, system, etc. A terminal may be used, for instance, to receive or provide analog or digital electrical signals (or simply signals) or to electrically connect to a common or ground reference. Accordingly, an input terminal or input is used to receive a signal from another component, device, system, etc. An output terminal or output is used to provide a signal to another component, device, system, etc. Other terminals may be used to connect to a common, ground, or voltage reference, e.g., a reference terminal or ground terminal. A terminal of an IC or a PCB may also be referred to as a pin (a longitudinal conductor) or a pad (a planar conductor). A node refers to a point of connection or interconnection of two or more terminals. An example number of terminals and nodes may be shown. However, depending on a particular circuit or system topology, there may be more or fewer terminals and nodes. However, in some instances, "terminal," "node," "interconnect," "pad," and "pin" may be used interchangeably.

Modifications are possible in the described examples, and other examples are possible, within the scope of the claims.

What is claimed is:

1. A circuit comprising:
an amplifier having an input terminal and an output terminal;
a capacitor having a first terminal and a second terminal, the first terminal of the capacitor coupled to the input terminal of the amplifier, the second terminal of the capacitor coupled to the output terminal of the amplifier; and
diode circuitry having a first terminal and a second terminal, the first terminal of the diode circuitry coupled to the first terminal of the capacitor and the input terminal of the amplifier, the second terminal of the diode circuitry coupled to the second terminal of the capacitor and the output terminal of the amplifier.

2. The circuit of claim 1, wherein the diode circuitry includes:
a resistor having a first terminal and a second terminal, the first terminal of the resistor coupled to the input terminal of the amplifier and the first terminal of the capacitor, the second terminal of the resistor coupled to the output terminal of the amplifier and the second terminal of the capacitor;
a first diode having an anode terminal and a cathode terminal, the anode terminal of the first diode coupled to the first terminal of the resistor, the first terminal of the capacitor, and the input terminal of the amplifier, the cathode terminal of the first diode coupled to the second terminal of the resistor, the second terminal of the capacitor, and the output terminal of the amplifier; and
a second diode having an anode terminal and a cathode terminal, the cathode terminal of the second diode coupled to the first terminal of the resistor, the first terminal of the capacitor, and the input terminal of the amplifier, the anode terminal of the second diode coupled to the second terminal of the resistor, the second terminal of the capacitor, and the output terminal of the amplifier.

3. The circuit of claim 1, wherein the diode circuitry includes:
a first resistor having a first terminal and a second terminal; the first terminal of the first resistor coupled to the first terminal of the capacitor and the input terminal of the amplifier;
a second resistor having a first terminal and a second terminal, the first terminal of the second resistor coupled to the second terminal of the first resistor, the second terminal of the second resistor coupled to the second terminal of the capacitor and the output terminal of the amplifier; and
a transistor having a first current terminal, a second current terminal, and a control terminal, the first current terminal of the transistor coupled to the first terminal of the first resistor, the first terminal of the capacitor, and the input terminal of the amplifier, the second current terminal of the transistor coupled to the second terminal of the second resistor, the second terminal of the capacitor, and the output terminal of the amplifier, the control terminal of the transistor coupled to the second terminal of the first resistor and the first terminal of the second resistor.

4. The circuit of claim 3, wherein the transistor is a first transistor, the diode circuitry further includes:

a third resistor having a first terminal and a second terminal; the first terminal of the third resistor coupled to the first terminal of the capacitor, the input terminal of the amplifier, the first terminal of the first resistor, and the first current terminal of the first transistor;
a fourth resistor having a first terminal and a second terminal, the first terminal of the fourth resistor coupled to the second terminal of the third resistor, the second terminal of the fourth resistor coupled to the second terminal of the capacitor, the output terminal of the amplifier, the second terminal of the second resistor, and the second current terminal of the first transistor; and
a second transistor having a first current terminal, a second current terminal, and a control terminal, the first current terminal of the second transistor coupled to the first terminal of the first resistor, the first terminal of the third resistor, the first current terminal of the first transistor, the first terminal of the capacitor, and the input terminal of the amplifier, the second current terminal of the second transistor coupled to the second terminal of the second resistor, the second terminal of the fourth resistor, the second current terminal of the first transistor, the second terminal of the capacitor, and the output terminal of the amplifier, the control terminal of the second transistor coupled to the second terminal of the third resistor and the first terminal of the fourth resistor.

5. The circuit of claim 1, wherein the diode circuitry includes:
a first resistor having a first terminal and a second terminal; the first terminal of the first resistor coupled to the first terminal of the capacitor and the input terminal of the amplifier;
a second resistor having a first terminal and a second terminal, the first terminal of the second resistor coupled to the second terminal of the first resistor;
a third resistor having a first terminal and a second terminal, the first terminal of the third resistor coupled to the second terminal of the second resistor, the second terminal of the third resistor coupled to the second terminal of the capacitor and the output terminal of the amplifier; and
a transistor having a first current terminal, a second current terminal, and a control terminal, the first current terminal of the transistor coupled to the first terminal of the first resistor, the first terminal of the capacitor, and the input terminal of the amplifier, the second current terminal of the transistor coupled to the second terminal of the third resistor, the second terminal of the capacitor, and the output terminal of the amplifier, the control terminal of the transistor coupled to the second terminal of the first resistor and the first terminal of the second resistor.

6. The circuit of claim 5, wherein the transistor is a first transistor, the diode circuitry further includes a second transistor having a first current terminal, a second current terminal, and a control terminal, the first current terminal of the second transistor coupled to the first terminal of the first resistor, the first current terminal of the first transistor, the first terminal of the capacitor, and the input terminal of the amplifier, the second current terminal of the second transistor coupled to the second terminal of the third resistor, the second current terminal of the first transistor, the second terminal of the capacitor, and the output terminal of the amplifier, the control terminal of the second transistor coupled to the second terminal of the second resistor and the first terminal of the third resistor.

7. The circuit of claim 1, wherein the amplifier, the capacitor, and the diode circuitry are part of a lossy integrator of a band-pass filter, the band-pass filter further comprising a lossy integrator coupled to the output terminal of the amplifier.

8. A bandpass filter comprising:

a lossless integrator having an input terminal and an output terminal;

a lossy integrator having an input terminal and an output terminal, the input terminal of the lossy integrator coupled to the output terminal of the lossless integrator, the output terminal of the lossy integrator coupled to the input terminal of the lossless integrator, the lossy integrator including:

an amplifier having an input terminal and an output terminal; and diode circuitry coupled to the input terminal of the amplifier and the output terminal of the amplifier.

9. The bandpass filter of claim 8, wherein:

the lossy integrator includes a capacitor having a first terminal and a second terminal; and the diode circuitry includes:

a resistor having a first terminal and a second terminal, the first terminal of the resistor coupled to the input terminal of the amplifier and the first terminal of the capacitor, the second terminal of the resistor coupled to the output terminal of the amplifier and the second terminal of the capacitor;

a first diode having an anode terminal and a cathode terminal, the anode terminal of the first diode coupled to the first terminal of the resistor, the first terminal of the capacitor, and the input terminal of the amplifier, the cathode terminal of the first diode coupled to the second terminal of the resistor, the second terminal of the capacitor, and the output terminal of the amplifier; and a second diode having an anode terminal and a cathode terminal, the cathode terminal of the second diode coupled to the first terminal of the resistor, the first terminal of the capacitor, and the input terminal of the amplifier, the anode terminal of the second diode coupled to the second terminal of the resistor, the second terminal of the capacitor, and the output terminal of the amplifier.

10. The bandpass filter of claim 8, wherein:

the lossy integrator includes a capacitor having a first terminal and a second terminal; and the diode circuitry includes:

a first resistor having a first terminal and a second terminal; the first terminal of the first resistor coupled to the first terminal of the capacitor and the input terminal of the amplifier;

a second resistor having a first terminal and a second terminal, the first terminal of the second resistor coupled to the second terminal of the first resistor, the second terminal of the second resistor coupled to the second terminal of the capacitor and the output terminal of the amplifier; and a transistor having a first current terminal, a second current terminal, and a control terminal, the first current terminal of the transistor coupled to the first terminal of the first resistor, the first terminal of the capacitor, and the input terminal of the amplifier, the second current terminal of the transistor coupled to the second terminal of the second resistor, the second terminal of the capacitor, and the output terminal of the amplifier, the control terminal of the transistor coupled to the second terminal of the first resistor and the first terminal of the second resistor.

11. The bandpass filter of claim 8, wherein:

the lossy integrator includes a capacitor having a first terminal and a second terminal; and the diode circuitry includes:

a first resistor having a first terminal and a second terminal; the first terminal of the first resistor coupled to the first terminal of the capacitor and the input terminal of the amplifier;

a second resistor having a first terminal and a second terminal, the first terminal of the second resistor coupled to the second terminal of the first resistor;

a third resistor having a first terminal and a second terminal, the first terminal of the third resistor coupled to the second terminal of the second resistor, the second terminal of the third resistor coupled to the second terminal of the capacitor and the output terminal of the amplifier; and a transistor having a first current terminal, a second current terminal, and a control terminal, the first current terminal of the transistor coupled to the first terminal of the first resistor, the first terminal of the capacitor, and the input terminal of the amplifier, the second current terminal of the transistor coupled to the second terminal of the third resistor, the second terminal of the capacitor, and the output terminal of the amplifier, the control terminal of the transistor coupled to the second terminal of the first resistor and the first terminal of the second resistor.

12. A filter circuit comprising:

an amplifier configured to amplify an input voltage based on a feedback resistance between an input and an output of the amplifier; and diode circuitry coupled between the input and output of the amplifier, the diode circuitry configured to, when the input voltage is above a threshold, reduce the feedback resistance.

13. The filter circuit of claim 12, wherein the threshold is a first threshold, the diode circuitry configured to, when the input voltage is below a second threshold, reduce the feedback resistance.

14. The filter circuit of claim 12, wherein the diode circuitry is configured to reduce the feedback resistance responsive to turning on.

15. The filter circuit of claim 12, wherein the diode circuitry is configured to, when the input voltage is below the threshold, increase the feedback resistance.

16. A circuit comprising:

an amplifier having an inverting input terminal, a non-inverting input terminal, and an inverting output terminal, and a non-inverting output terminal;

a first capacitor having a first terminal and a second terminal, the first terminal of the first capacitor coupled to the inverting input terminal of the amplifier, the second terminal of the first capacitor coupled to the non-inverting output terminal of the amplifier;

first diode circuitry having a first terminal and a second terminal, the first terminal of the first diode circuitry coupled to the first terminal of the first capacitor and the inverting input terminal of the amplifier, the second terminal of the first diode circuitry coupled to the second terminal of the first capacitor and the non-inverting output terminal of the amplifier;

a second capacitor having a first terminal and a second terminal, the first terminal of the second capacitor coupled to the non-inverting input terminal of the amplifier, the second terminal of the second capacitor coupled to the inverting output terminal of the amplifier; and second diode circuitry having a first terminal and a second terminal, the first terminal of the second diode circuitry coupled to the first terminal of the second capacitor and the non-inverting input terminal of the amplifier, the second terminal of the second diode circuitry coupled to the second terminal of the second capacitor and the inverting output terminal of the amplifier.

17. The circuit of claim 16, further including a lossless integrator having an a first input terminal, a second input terminal, a first output terminal and a second output terminal, the first input terminal of the lossless integrator coupled to the non-inverting output terminal of the amplifier, the second input terminal of the lossless integrator coupled to the inverting output terminal of the amplifier, the first output terminal of the lossless integrator coupled to the inverting input terminal of the amplifier via a first resistor, and the second output terminal of the lossless integrator coupled to the non-inverting input terminal of the amplifier first a second resistor.

18. The circuit of claim 16, wherein the first diode circuitry includes:

a resistor having a first terminal and a second terminal, the first terminal of the resistor coupled to the inverting input terminal of the amplifier and the first terminal of the first capacitor, the second terminal of the resistor coupled to the non-inverting output terminal of the amplifier and the second terminal of the first capacitor;

a first diode having an anode terminal and a cathode terminal, the anode terminal of the first diode coupled to the first terminal of the resistor, the first terminal of the first capacitor, and the inverting input terminal of the amplifier, the cathode terminal of the first diode coupled to the second terminal of the resistor, the second terminal of the first capacitor, and the non-inverting output terminal of the amplifier; and a second diode having an anode terminal and a cathode terminal, the cathode terminal of the second diode coupled to the first terminal of the resistor, the first terminal of the first capacitor, and the inverting input terminal of the amplifier, the anode terminal of the second diode coupled to the second terminal of the resistor, the second terminal of the first capacitor, and the non-inverting output terminal of the amplifier.

19. The circuit of claim 16, wherein the first diode circuitry includes:

a first resistor having a first terminal and a second terminal; the first terminal of the first resistor coupled to the first terminal of the first capacitor and the inverting input terminal of the amplifier;

a second resistor having a first terminal and a second terminal, the first terminal of the second resistor coupled to the second terminal of the first resistor, the second terminal of the second resistor coupled to the second terminal of the first capacitor and the non-inverting output terminal of the amplifier; and a transistor having a first current terminal, a second current terminal, and a control terminal, the first current terminal of the transistor coupled to the first terminal of the first resistor, the first terminal of the first capacitor, and the inverting input terminal of the amplifier, the second current terminal of the transistor coupled to the second terminal of the second resistor, the second terminal of the first capacitor, and the non-inverting output terminal of the amplifier, the control terminal of the transistor coupled to the second terminal of the first resistor and the first terminal of the second resistor.

20. The circuit of claim 19, wherein the transistor is a first transistor, the first diode circuitry further includes:

a third resistor having a first terminal and a second terminal; the first terminal of the third resistor coupled to the first terminal of the first capacitor, the inverting input terminal of the amplifier, the first terminal of the first resistor, and the first current terminal of the first transistor;

a fourth resistor having a first terminal and a second terminal, the first terminal of the fourth resistor coupled to the second terminal of the third resistor, the second terminal of the fourth resistor coupled to the second terminal of the first capacitor, the non-inverting output terminal of the amplifier, the second terminal of the second resistor, and the second current terminal of the first transistor; and a second transistor having a first current terminal, a second current terminal, and a control terminal, the first current terminal of the second transistor coupled to the first terminal of the first resistor, the first terminal of the third resistor, the first current terminal of the first transistor, the first terminal of the first capacitor, and the inverting input terminal of the amplifier, the second current terminal of the second transistor coupled to the second terminal of the second resistor, the second terminal of the fourth resistor, the second current terminal of the first transistor, the second terminal of the first capacitor, and the non-inverting output terminal of the amplifier, the control terminal of the second transistor coupled to the second terminal of the third resistor and the first terminal of the fourth resistor.

21. The circuit of claim 16, wherein the first diode circuitry includes:

a first resistor having a first terminal and a second terminal; the first terminal of the first resistor coupled to the first terminal of the first capacitor and the inverting input terminal of the amplifier;

a second resistor having a first terminal and a second terminal, the first terminal of the second resistor coupled to the second terminal of the first resistor;

a third resistor having a first terminal and a second terminal, the first terminal of the third resistor coupled to the second terminal of the second resistor, the second terminal of the third resistor coupled to the second terminal of the first capacitor and the non-inverting output terminal of the amplifier; and a transistor having a first current terminal, a second current terminal, and a control terminal, the first current terminal of the transistor coupled to the first terminal of the first resistor, the first terminal of the first capacitor, and the inverting input terminal of the amplifier, the second current terminal of the transistor coupled to the second terminal of the third resistor, the second terminal of the first capacitor, and the non-inverting output terminal of the amplifier, the control terminal of the transistor coupled to the second terminal of the first resistor and the first terminal of the second resistor.

* * * * *